United States Patent
Imai et al.

(10) Patent No.: US 7,257,457 B2
(45) Date of Patent: Aug. 14, 2007

(54) SYSTEM AND METHOD FOR MONITORING SEMICONDUCTOR PRODUCTION APPARATUS

(75) Inventors: Shinichi Imai, Osaka (JP); Masaki Taguchi, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 555 days.

(21) Appl. No.: 10/619,191

(22) Filed: Jul. 15, 2003

(65) Prior Publication Data

US 2004/0049898 A1 Mar. 18, 2004

(30) Foreign Application Priority Data

Jul. 15, 2002 (JP) ............... 2002-205667

(51) Int. Cl.
*G06F 19/00* (2006.01)

(52) U.S. Cl. ...................... 700/121; 700/108

(58) Field of Classification Search ............ 700/28–31, 700/51, 108–110, 121
See application file for complete search history.

(56) References Cited

U.S. PATENT DOCUMENTS

| | | | | |
|---|---|---|---|---|
| 5,949,678 A | * | 9/1999 | Wold et al. ................... 700/83 |
| 5,953,688 A | * | 9/1999 | Su et al. ...................... 702/185 |
| 6,521,080 B2 | * | 2/2003 | Balasubramhanya et al. .... 156/345.24 |
| 6,549,864 B1 | * | 4/2003 | Potyrailo ...................... 702/81 |
| 6,564,119 B1 | * | 5/2003 | Vaculik et al. ............... 700/146 |
| 6,853,920 B2 | * | 2/2005 | Hsiung et al. .................. 702/1 |
| 6,885,907 B1 | * | 4/2005 | Zhang et al. ............... 700/146 |
| 6,896,763 B2 | * | 5/2005 | Balasubramhanya et al. .... 156/345.24 |
| 6,952,657 B2 | * | 10/2005 | Jahns et al. .................. 702/182 |
| 6,985,215 B2 | * | 1/2006 | Oh et al. ....................... 356/72 |
| 7,054,786 B2 | * | 5/2006 | Sakano et al. ............... 702/183 |
| 7,062,417 B2 | * | 6/2006 | Kruger et al. .................. 703/2 |
| 7,101,458 B2 | * | 9/2006 | Oh et al. ............... 156/345.25 |
| 2002/0042694 A1 | * | 4/2002 | Henry et al. ................. 702/188 |
| 2003/0083756 A1 | * | 5/2003 | Hsiung et al. ................ 700/28 |
| 2003/0109951 A1 | * | 6/2003 | Hsiung et al. .............. 700/108 |
| 2003/0139905 A1 | * | 7/2003 | Helsper et al. ............. 702/182 |
| 2004/0091135 A1 | * | 5/2004 | Bourg, Jr. et al. .......... 382/110 |
| 2004/0267399 A1 | * | 12/2004 | Funk .......................... 700/121 |
| 2005/0143952 A1 | * | 6/2005 | Tomoyasu et al. .......... 702/181 |
| 2005/0146709 A1 | * | 7/2005 | Oh et al. ....................... 356/72 |
| 2005/0171627 A1 | * | 8/2005 | Funk et al. ................. 700/121 |

FOREIGN PATENT DOCUMENTS

| | | |
|---|---|---|
| JP | 08-31807 | 2/1996 |
| JP | 10-135091 | 5/1998 |
| JP | 2000-198051 | 7/2000 |
| JP | P2000-207306 | 7/2000 |
| JP | 2000-252179 | 9/2000 |
| JP | 2000-252180 | 9/2000 |
| JP | 2002-025981 | 1/2002 |
| JP | 2002-110493 | 4/2002 |

OTHER PUBLICATIONS

Japanese Notice of Reasons for Rejection dated May 15, 2007.

* cited by examiner

*Primary Examiner*—M. N. Von Buhr
(74) *Attorney, Agent, or Firm*—McDermott Will & Emery LLP

(57) ABSTRACT

A plurality of pieces of process data are acquired from a semiconductor production apparatus while it is in operation, and then, a multivariate analysis model is created using at least a portion of the plurality of pieces of process data.

10 Claims, 15 Drawing Sheets

FIG. 3A [Step1]
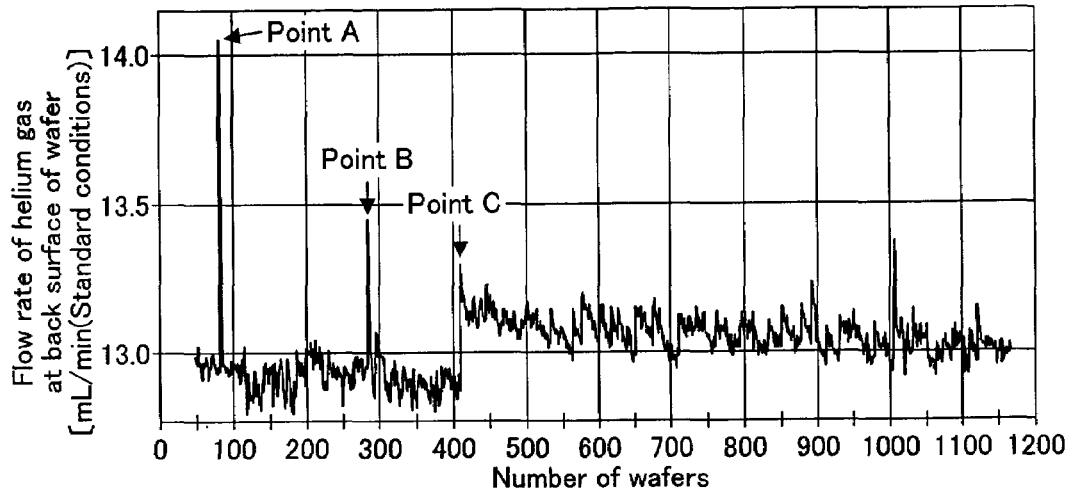
FIG. 3B [Step2]
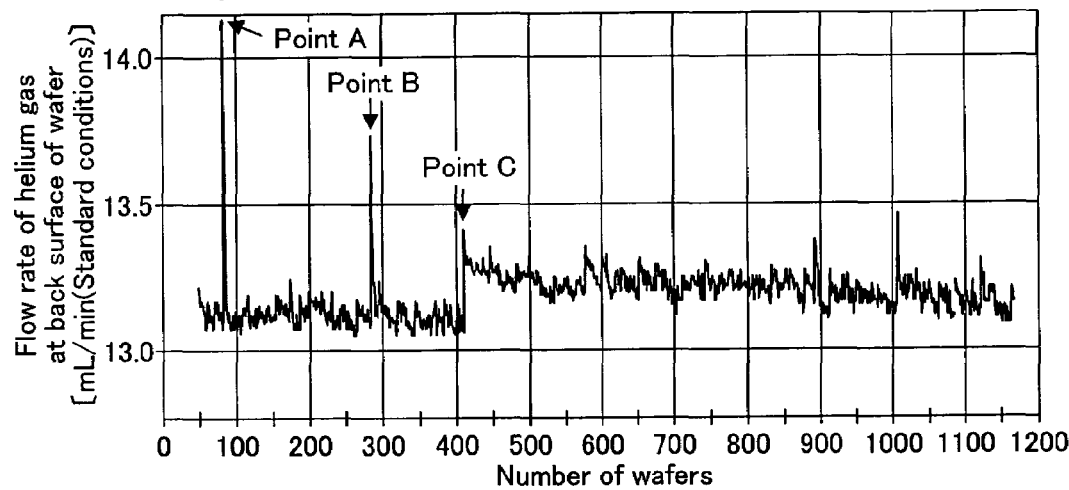
FIG. 3C [Step3]
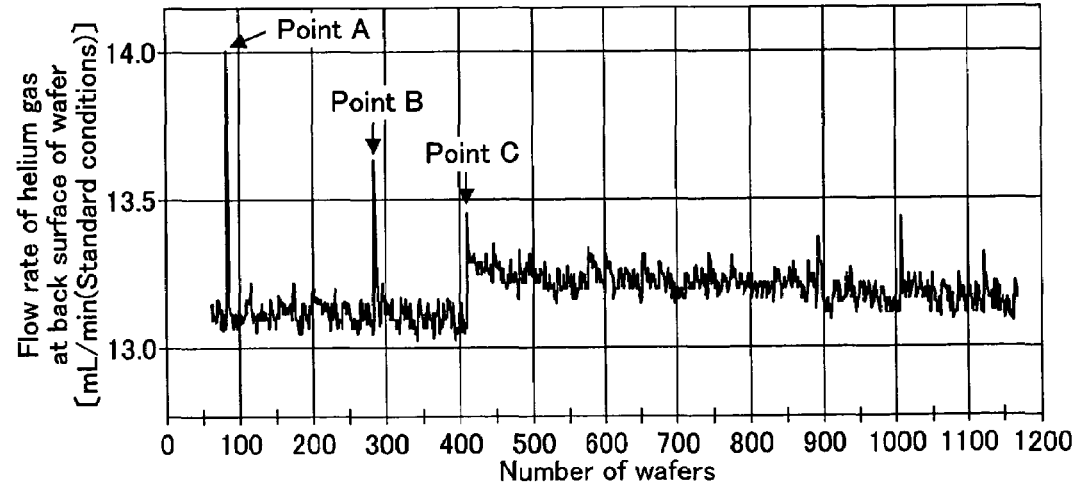

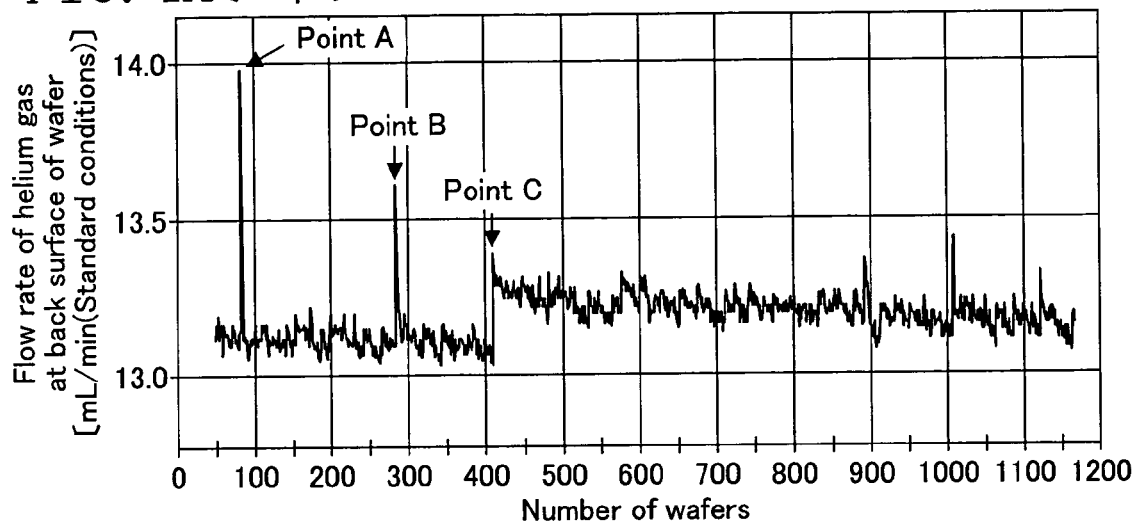
FIG. 4A [Step4]
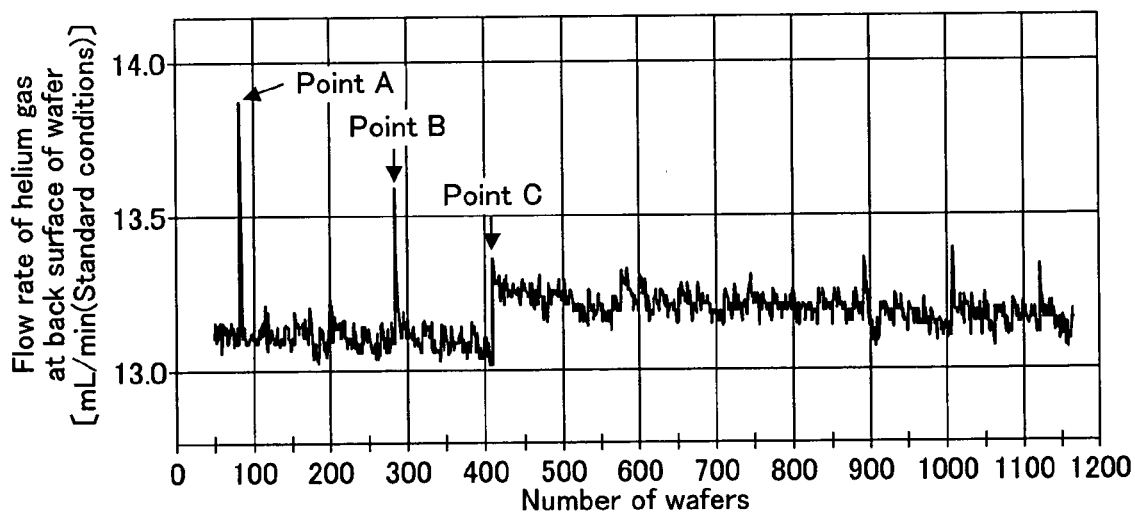
FIG. 4B [Step5]

FIG. 5A [Step1]
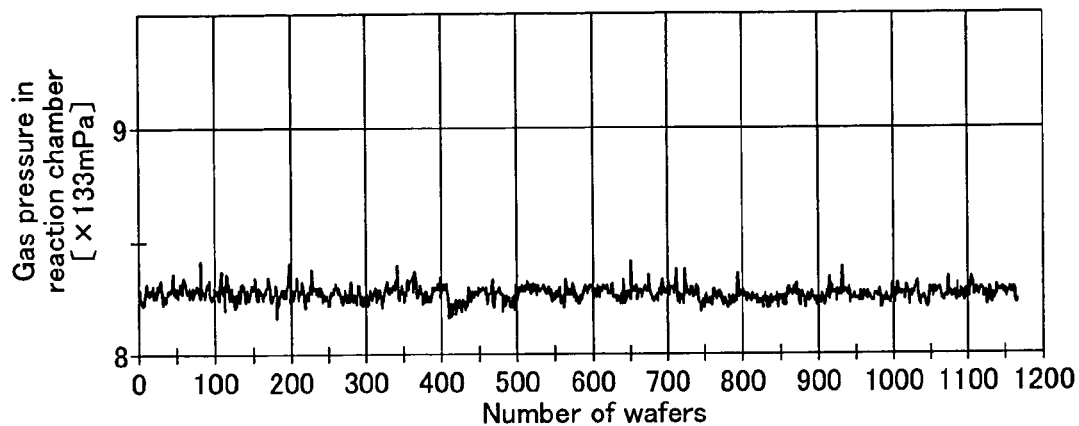
FIG. 5B [Step2]
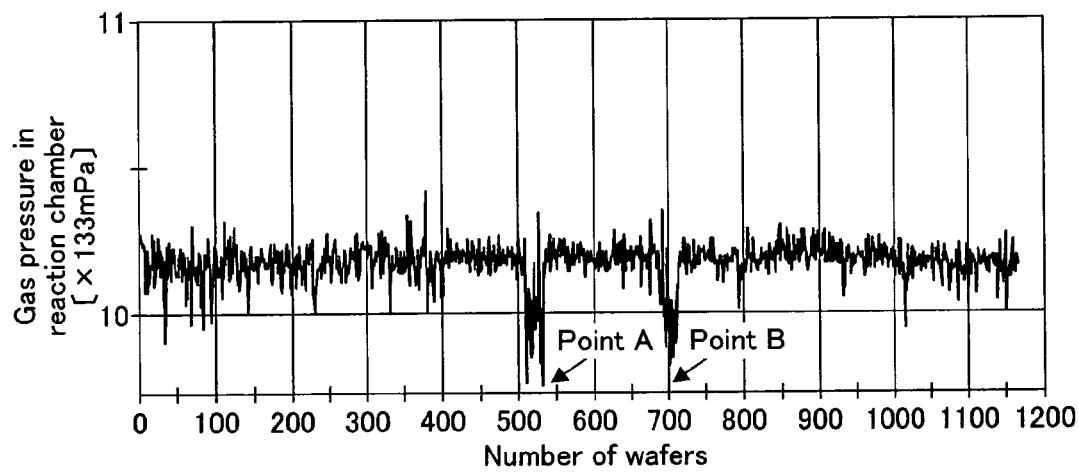
FIG. 5C [Step3]
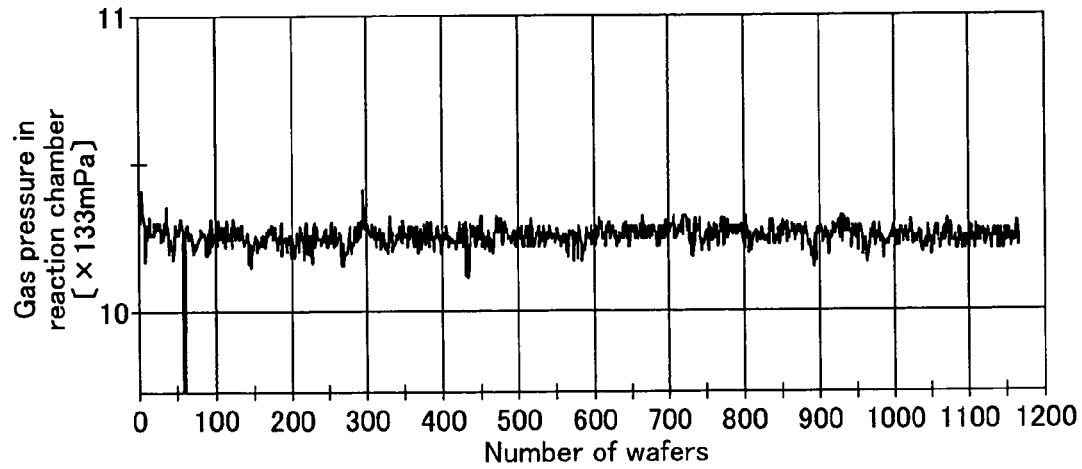

FIG. 6A [Step4]
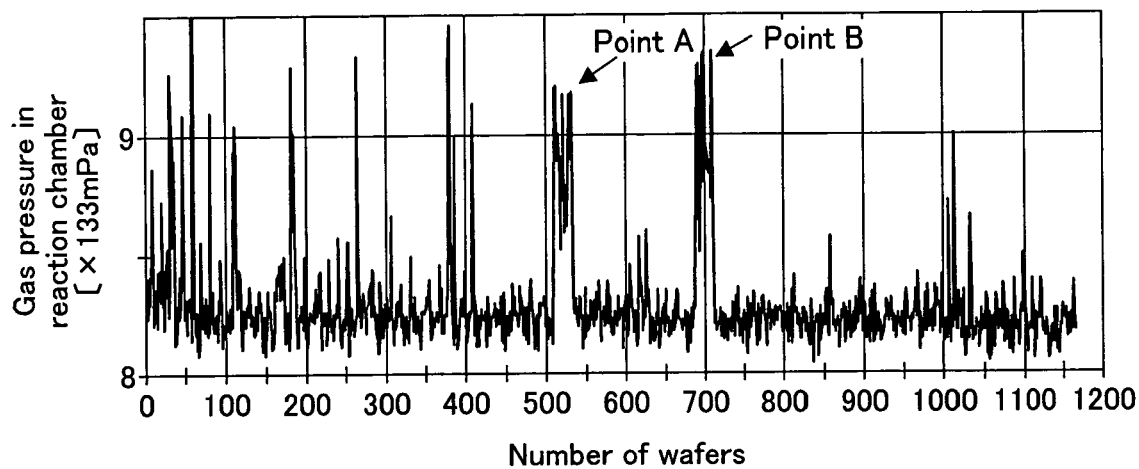
FIG. 6B [Step5]
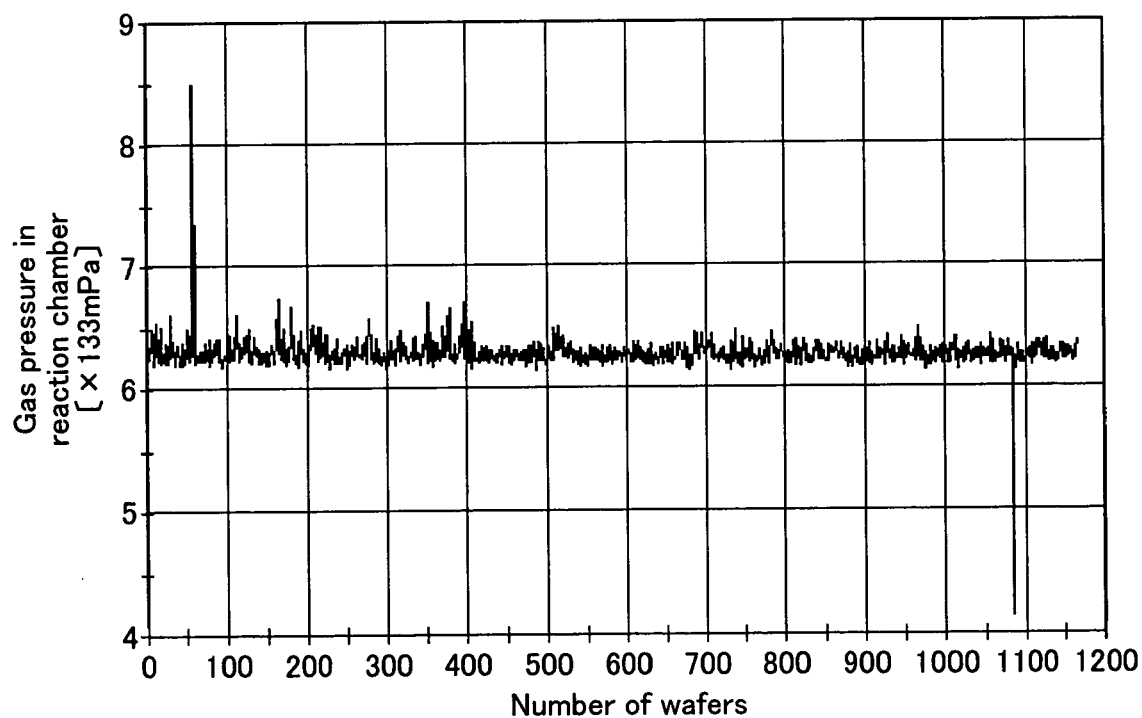

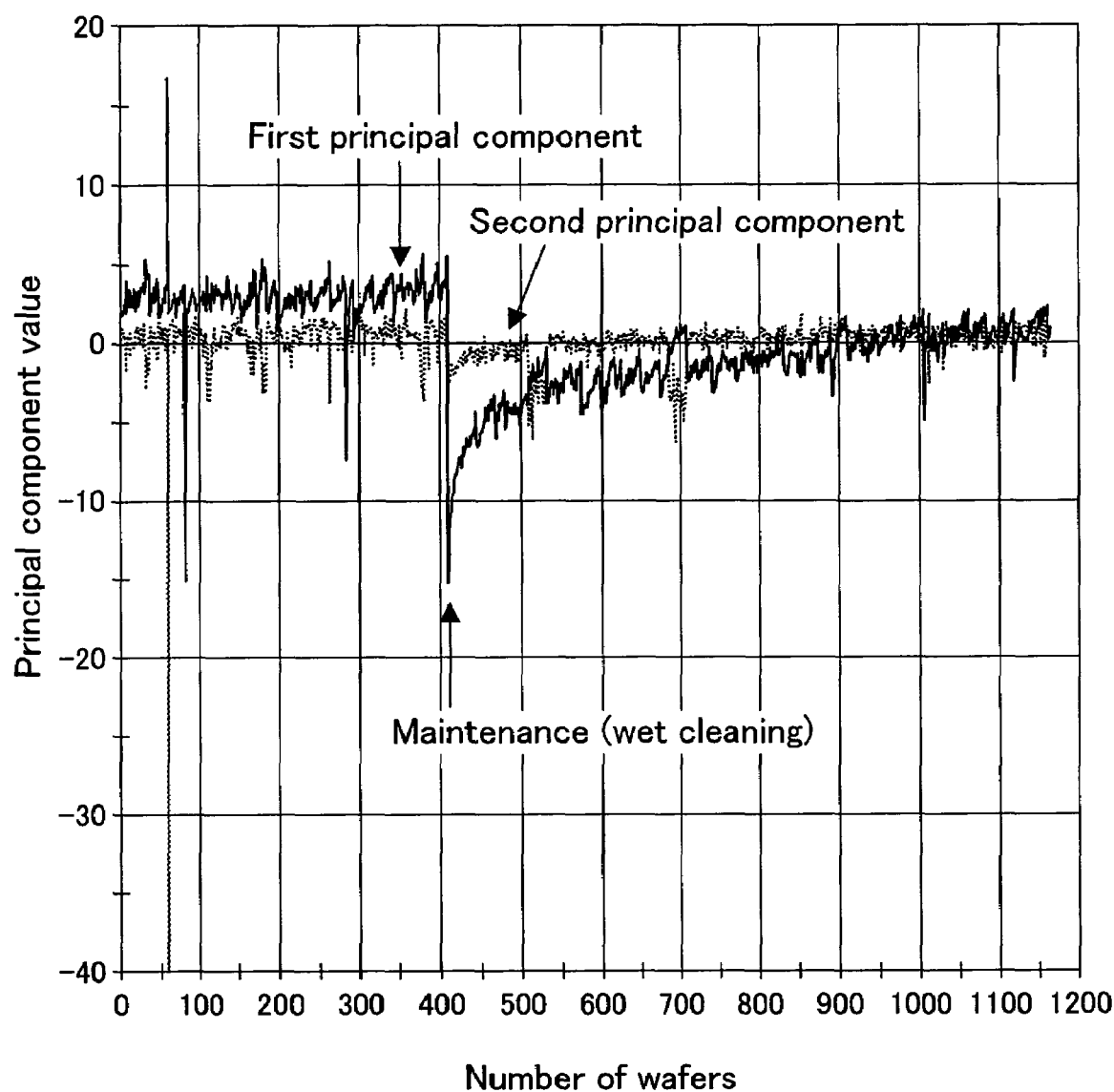

SYSTEM AND METHOD FOR MONITORING SEMICONDUCTOR PRODUCTION APPARATUS

BACKGROUND OF THE INVENTION

The present invention relates to a monitoring technique for ascertaining the operation status of an apparatus for producing a semiconductor device on the real time basis.

In recent years, production processes of semiconductor devices have become complicated along with miniaturization of the semiconductor devices. Thus, when a defective semiconductor device is produced or when the production yield of a semiconductor device is decreased, it requires a long time to track down the cause of the problem, e.g., to find whether the cause is in a production process or in a production apparatus. Moreover, the process margin in the production of a semiconductor device has been decreasing along with an increase in the integration density of the semiconductor device. As a result, a variation in the production yield of the semiconductor device, which occurs due to an internal error of a production apparatus (process variation among chambers of a multi-chambered production apparatus) or a difference among production apparatuses (process variation among production apparatuses of the same type), has become a great problem. Therefore, in a production process of a highly integrated semiconductor device, a technique for measuring the operation status of a production apparatus on the real time basis, i.e., a technique for monitoring the operation status of a production apparatus, is very important.

Now, a conventional monitoring technique for a semiconductor production apparatus is described while exemplifying a plasma etching apparatus, which is one of typical semiconductor production apparatuses.

FIG. 14 illustrates monitoring of the operation status of the plasma etching apparatus with a conventional monitoring apparatus.

As shown in FIG. 14, the plasma etching apparatus 100 includes a reaction chamber 103 having a lower electrode 102 on which a substrate 101 to be processed is placed. At one side of the reaction chamber 103, a flowmeter (mass flow controller) 104 through which a process gas is supplied into the reaction chamber 103 and a pressure sensor 105 (such as Baratron, or the like) for measuring the gas pressure in the reaction chamber 103 are connected. On the other side of the reaction chamber 103, a vacuum pump 106 for discharging the process gas is connected through a conductance valve (ACP valve) 107. The conductance valve 107 adjusts the amount of the process gas to be discharged. At the bottom of the reaction chamber 103, a high frequency power supply 108 for supplying a high frequency power to the lower electrode 102 is connected through a matcher 109 and an additional sensor 110. Further, a chiller 111 is connected to the bottom of the reaction chamber 103.

Further, the plasma etching apparatus 100 includes a controller computer 112 which is connected through signal lines to the control devices, i.e., the flowmeter 104, the pressure chamber 105, the conductance valve 107, the high frequency power supply 108, the matcher 109, and the chiller 111. The controller computer 112 retains a plurality of pieces of process data acquired from the control devices, such as gas flow rate, gas pressure, degree of valve opening, plasma content value, etc., i.e., the values of a plurality of process parameters which represent the operation status of the plasma etching apparatus 100, in the form of digital data for a certain time period. The controller computer 112 is connected via network to a host computer 10 which manages a plurality of semiconductor production apparatuses including the plasma etching apparatus 100 and a monitoring apparatus (monitoring tool) 20 for ascertaining the operation status of the plasma etching apparatus 100. The monitoring tool 20 acquires a plurality of pieces of process data from the controller computer 112. Note that the sampling rate for the process data in the controller computer 112 is about one second, and thus, a transient variation cannot be observed in parameters of certain types. In order to avoid such inconvenience, the monitoring tool 20 is directly connected through signal lines to the control devices of the plasma etching apparatus 100 (specifically, the flowmeter 104, the pressure chamber 105, the matcher 109, and the additional sensor 110), whereby the monitoring tool 20 can acquire the process data directly from these control devices in the form of analog data.

Next, a conventional monitoring method for a semiconductor production apparatus is described with an example where process data is acquired in the form of analog data directly from the respective control devices of the plasma etching apparatus 100 using the monitoring tool 20 shown in FIG. 14.

FIG. 15 is a flowchart of the conventional monitoring method.

In the first process P1, a plurality of pieces of process data are acquired in the form of analog data directly from the respective control devices of the plasma etching apparatus 100 using the monitoring tool 20, and the acquired process data are retained in a recording medium of the monitoring tool 20.

In the second process P2, the plurality of pieces of process data retained in the recording medium of the monitoring tool 20 are transferred to a recording medium of another computer using a flexible disk, or the like.

In the third process P3, the plurality of pieces of process data are plotted on the time series in the another computer, whereby the trend management of the operation status of the plasma etching apparatus 100 is performed.

In the conventional monitoring method for a semiconductor production apparatus, a variation in each of the process parameter values in the semiconductor production apparatus can be monitored. However, it is necessary for determining whether the operation status of the semiconductor production apparatus is normal or abnormal to observe all of the process parameter values and employ a human (operator) in evaluating the operation status of the semiconductor production apparatus based on the observation result, i.e., all of the process data. That is, in the conventional monitoring technique, evaluation of the operation status of the semiconductor production apparatus cannot be automated. In other words, evaluation of the operation status of the semiconductor production apparatus cannot be performed both objectively and quickly.

In the conventional monitoring method, even when a process recipe consists of a plurality of steps, a statistical value of the process data is not calculated at every step. FIG. 16 shows a monitoring result of the power of a progressive wave of the high frequency power applied to the lower electrode in the etching apparatus shown in FIG. 14. As shown in FIG. 16, one process recipe for the etching apparatus consists of 5 steps, Steps S1 to S5, and the value of the power of the progressive wave is different among the steps. However, in the conventional monitoring method for the semiconductor production apparatus, the statistical value of the process data is not calculated at every step, and therefore, the operation status of the semiconductor production apparatus cannot be accurately ascertained.

SUMMARY OF THE INVENTION

In view of the above, the first objective of the present invention is to achieve evaluation of the operation status of a semiconductor production apparatus both objectively and quickly, and the second objective of the present invention is to correctly ascertain the operation status of the semiconductor production apparatus.

In order to achieve the first objective, the first monitoring system of the present invention for monitoring a semiconductor production apparatus comprises data acquisition means for acquiring from the semiconductor production apparatus a plurality of pieces of process data including values of a plurality of process parameters which are obtained while the semiconductor production apparatus is in operation; and model creation means for creating a multivariate analysis model using at least a portion of the plurality of pieces of process data.

According to the first monitoring system, a multivariate analysis model is created using a plurality of process parameter values acquired from the semiconductor production apparatus while it is in operation, i.e., a plurality of pieces of process data. Thus, as for a plurality of pieces of new process data, for example, a principal component value of the new process data, a distance between the new process data and the model, or the like, can be calculated. Moreover, real-time monitoring of the calculated value can be performed. Specifically, for example, by monitoring the principal component value in time series, evaluation of the operation status of a semiconductor production apparatus can be performed both objectively and quickly, as compared with a case where a large number of process parameter values are observed and the observation results are evaluated using a certain human sense. Furthermore, it is possible to quantitatively obtain the distance between a plurality of pieces of new process data and the model using, for example, Error Matrix E. That is, Error Matrix E represents the distance from the model, and it is possible to determine whether the operation status of the semiconductor production apparatus is normal or abnormal based on the distance. As a result, it is possible to represent the operation status of the semiconductor production apparatus by a single value (index value). Since the operation status of the semiconductor production apparatus can be represented as an index, the operation status of the semiconductor production apparatus can be managed only by managing the index value. Therefore, evaluation of the operation status of the semiconductor production apparatus can be performed both objectively and more quickly.

In order to achieve the first and second objectives, the second monitoring system of the present invention for monitoring a semiconductor production apparatus comprises: data acquisition means for acquiring from the semiconductor production apparatus a plurality of pieces of process data including values of a plurality of process parameters which correspond to a plurality of steps of a process recipe, the values being obtained while the semiconductor production apparatus is in operation; data dividing means for dividing the plurality of pieces of process data for the respective process parameters and for the respective steps; and model creation means for creating a multivariate analysis model using data obtained by dividing the plurality of pieces of process data.

According to the second monitoring system, the following effects can be obtained in addition to the effects of the first monitoring system. The process data acquired from the semiconductor production apparatus while it is in operation can be monitored separately for the respective steps of the process recipe. Thus, ascertainment of the operation status of the semiconductor production apparatus, e.g., identification of an abnormal device, can be carried out precisely by checking data obtained by dividing the process data for the respective steps or a statistical value thereof as necessary.

In the first or second monitoring system, the semiconductor production apparatus includes a plurality of control devices and a controller computer connected to the plurality of control devices. The data acquisition means may be connected to the controller computer and may acquire from the controller computer the plurality of pieces of process data in the form of digital data. In this case, the data acquisition means may acquire the plurality of pieces of process data using SECS, GEM, or HSMS.

In the first or second monitoring system, the semiconductor production apparatus includes a plurality of control devices. The data acquisition means may be connected to the plurality of control devices and may acquire from the plurality of control devices the plurality of pieces of process data in the form of analog data.

In the case where the first or second monitoring system further comprises data evaluation means for evaluating a plurality of pieces of new process data including values of the plurality of process parameters, which are newly acquired by the data acquisition means based on the multivariate analysis model created by the model creation means, to determine whether the operation status of the semiconductor production apparatus is normal or abnormal, the above-described effects of the present invention can surely be obtained.

In the case where the monitoring system includes the data evaluation means, it is preferable that the monitoring system further comprises: lot information acquisition means for acquiring from the semiconductor production apparatus its process lot information; and lot information addition means for adding the process lot information acquired by the lot information acquisition means to the plurality of pieces of new process data.

With such an arrangement, the process lot information is coupled to the process data on the data space. Therefore, it is possible to collate the operation statuses of the semiconductor production apparatus with lot results and, on the contrary, to collate the lot results with the operation statues of the semiconductor production apparatus. Thus, it is possible to quickly ascertain what operation status the semiconductor production apparatus was in when a defective wafer process was performed.

In the case where the monitoring system includes the data evaluation means, it is preferable that the semiconductor production apparatus is connected to a host computer which retains process lot information of the semiconductor production apparatus; and the monitoring system further includes lot information acquisition means for acquiring the process lot information from the host computer, and lot information addition means for adding the process lot information acquired by the lot information acquisition means to the plurality of pieces of new process data.

With such an arrangement, the process lot information is coupled to the process data on the data space. Therefore, it is possible to collate the operation statuses of the semiconductor production apparatus with lot results and, on the contrary, to collate the lot results with the operation statues of the semiconductor production apparatus. Thus, it is possible to quickly ascertain what operation status the semiconductor production apparatus was in when a defective wafer process was performed.

In the first or second monitoring system for a semiconductor production apparatus, when the model creation means performs at least a principal component analysis, the above-described effects of the present invention can surely be obtained.

In order to achieve the first objective, the third monitoring system of the present invention for monitoring a plurality of semiconductor production apparatuses comprises: a plurality of data acquisition means, each data acquisition means acquiring from a corresponding one of the plurality of semiconductor production apparatuses a plurality of pieces of process data including values of a plurality of process parameters which are obtained while the plurality of semiconductor production apparatuses are in operation; a plurality of model creation means, each model creation means creating a multivariate analysis model using at least a portion of the plurality of pieces of process data which are obtained by the each of the plurality of data acquisition means; a plurality of data evaluation means, each data evaluation means evaluating a plurality of pieces of new process data including values of the plurality of process parameters which are newly acquired by the each of the plurality of data acquisition means based on the multivariate analysis model created by the each of the plurality of model creation means, thereby determining whether the operation status of the corresponding one of the plurality of semiconductor production apparatuses is normal or abnormal; and central monitoring means for accessing the respective one of the plurality of data evaluation means at a predetermined time interval to acquire results of the determination by the respective one of the plurality of data evaluation means as to whether the operation statuses of the plurality of semiconductor production apparatuses are normal or abnormal.

According to the third monitoring system, the following effects can be obtained in addition to the effects of the first monitoring system. Since the monitoring system includes the central monitoring means which accesses the respective one of the plurality of data evaluation means at a predetermined time interval to obtain results of determination by the plurality of data evaluation means as to whether the operation statuses of the plurality of semiconductor production apparatuses are normal or abnormal, it is possible to automatically ascertain the operation statuses of the plurality of semiconductor production apparatuses.

In order to achieve the first and second objectives, the fourth monitoring system of the present invention for monitoring a plurality of semiconductor production apparatuses comprises: a plurality of data acquisition means, each data acquisition means acquiring from a corresponding one of the plurality of semiconductor production apparatuses a plurality of pieces of process data including values of a plurality of process parameters which correspond to a plurality of steps of a process recipe, the values being obtained while the plurality of semiconductor production apparatuses are in operation; a plurality of data dividing means, each data dividing means dividing the plurality of pieces of process data, which are acquired by the each of the plurality of data acquisition means, for the respective process parameters and for the respective steps; a plurality of model creation means, each model creation means creating a multivariate analysis model using data obtained by dividing the plurality of pieces of process data by the each of the plurality of data dividing means; a plurality of data evaluation means, each data evaluation means evaluating a plurality of pieces of new process data including values of the plurality of process parameters which are newly acquired by the each of the plurality of data acquisition means based on the multivariate analysis model created by the each of the plurality of model creation means, thereby determining whether the operation status of the corresponding one of the plurality of semiconductor production apparatuses is normal or abnormal; and central monitoring means for accessing the respective one of the plurality of data evaluation means at a predetermined time interval to acquire results of determination by the respective one of the plurality of data evaluation means as to whether the operation statuses of the plurality of semiconductor production apparatuses are normal or abnormal.

According to the fourth monitoring system for semiconductor production apparatuses, the following effects can be obtained in addition to the effects of the first and second monitoring systems. Since the monitoring system includes the central monitoring means which accesses the respective one of the plurality of data evaluation means at a predetermined time interval to obtain results of determination by the plurality of data evaluation means as to whether the operation statuses of the plurality of semiconductor production apparatuses are normal or abnormal, it is possible to automatically ascertain the operation statuses of the plurality of semiconductor production apparatuses.

In order to achieve the first objective, the first monitoring method of the present invention for monitoring a semiconductor production apparatus comprises: a data acquisition step of acquiring from the semiconductor production apparatus a plurality of pieces of process data including values of a plurality of process parameters which are obtained while the semiconductor production apparatus is in operation; and a model creation step of creating a multivariate analysis model using at least a portion of the plurality of pieces of process data.

According to the first monitoring method, a multivariate analysis model is created using a plurality of pieces of process data acquired from the semiconductor production apparatus while it is in operation. Thus, as for a plurality of pieces of new process data, for example, a principal component value of the new process data, a distance between the new process data and the model, or the like, can be calculated. Moreover, real-time monitoring of the calculated value can be performed. Specifically, for example, by monitoring the principal component value in time series, evaluation of the operation status of a semiconductor production apparatus can be performed both objectively and quickly, as compared with a case where a large number of process parameter values are observed and the observation results are evaluated using a certain human sense. Furthermore, it is possible to quantitatively obtain the distance between a plurality of pieces of new process data and the model using, for example, Error Matrix E. That is, Error Matrix E represents the distance from the model, and it is possible to determine whether the operation status of the semiconductor production apparatus is normal or abnormal based on the distance. As a result, it is possible to represent the operation status of the semiconductor production apparatus by a single value (index value). Thus, since the operation status of the semiconductor production apparatus can be managed only by managing the index value, evaluation of the operation status of the semiconductor production apparatus can be performed both objectively and more quickly.

In order to achieve the first and second objectives, the second monitoring method of the present invention comprises: a data acquisition step of acquiring from the semiconductor production apparatus a plurality of pieces of process data including values of a plurality of process parameters which correspond to a plurality of steps of a process recipe, the values being obtained while the semiconductor production apparatus is in operation; a data dividing step of dividing the plurality of pieces of process data for the respective process parameters and for the respective steps; and a model creation step of creating a multivariate analysis model using data obtained by dividing the plurality of pieces of process data.

According to the second monitoring method, the following effects can be obtained in addition to the effects of the first monitoring method. The process data acquired from the semiconductor production apparatus while it is in operation can be monitored separately for the respective steps of the process recipe. Thus, ascertainment of the operation status of the semiconductor production apparatus, e.g., identification of an abnormal device, can be carried out precisely by checking data obtained by dividing the process data for the respective steps or a statistical value thereof as necessary.

In the first or second monitoring method, the semiconductor production apparatus includes a plurality of control devices and a controller computer connected to the plurality of control devices. The data acquisition step may include a step of acquiring from the controller computer the plurality of pieces of process data in the form of digital data. In this case, the data acquisition step may include a step of acquiring the plurality of pieces of process data using SECS, GEM, or HSMS.

In the first or second monitoring method, the semiconductor production apparatus includes a plurality of control devices. The data acquisition step may include a step of acquiring from the plurality of control devices the plurality of pieces of process data in the form of analog data.

In the case where the first or second monitoring method further comprises a data evaluation step of evaluating a plurality of pieces of new process data including values of the plurality of process parameters, which are newly acquired at the data acquisition step, based on the multivariate analysis model created at the model creation step, to determine whether the operation status of the semiconductor production apparatus is normal or abnormal, the above-described effects of the present invention can surely be obtained.

In the case where the monitoring method includes the data evaluation step, it is preferable that the monitoring method further comprises: a lot information acquisition step of acquiring from the semiconductor production apparatus its process lot information; and a lot information addition step of adding the process lot information acquired at the lot information acquisition step to the plurality of pieces of new process data.

With such an arrangement, the process lot information is coupled to the process data on the data space. Therefore, it is possible to collate the operation statuses of the semiconductor production apparatus with lot results and, on the contrary, to collate the lot results with the operation statues of the semiconductor production apparatus. Thus, it is possible to quickly ascertain what operation status the semiconductor production apparatus was in when a defective wafer process was performed.

In the case where the monitoring method includes the data evaluation step, it is preferable that the semiconductor production apparatus is connected to a host computer which retains process lot information of the semiconductor production apparatus; and the monitoring method further includes a lot information acquisition step of acquiring the process lot information from the host computer, and a lot information addition step of adding the process lot information acquired at the lot information acquisition step to the plurality of pieces of new process data.

With such an arrangement, the process lot information is coupled to the process data on the data space. Therefore, it is possible to collate the operation statuses of the semiconductor production apparatus with lot results and, on the contrary, to collate the lot results with the operation statues of the semiconductor production apparatus. Thus, it is possible to quickly ascertain what operation status the semiconductor production apparatus was in when a defective wafer process was performed.

In the first or second monitoring method, in the case where the model creation step includes a step of performing at least a principal component analysis, the above-described effects of the present invention can surely be obtained.

As described above, according to the present invention, a multivariate analysis model is created using a plurality of pieces of process data of the semiconductor production apparatus. Thus, as for a plurality of pieces of new process data, for example, a principal component value of the new process data, a distance between the new process data and the model, or the like, can be calculated. Moreover, real-time monitoring of the calculated value can be performed. Therefore, evaluation of the operation status of the semiconductor production apparatus can be performed both objectively and quickly, as compared with a case where a large number of process parameter values are observed and the observation results are evaluated using a certain human sense. Furthermore, the process data of the semiconductor production apparatus can be monitored separately for the respective steps of the process recipe. Thus, ascertainment of the operation status of the semiconductor production apparatus can be carried out precisely by checking divisional data, which is obtained by dividing the process data for the respective steps, or a statistical value thereof as necessary.

BRIEF DESCRIPTION OF THE DRAWINGS

FIGS. 3A to 3C show the dependence of the flow rate of a helium gas flowing between a lower electrode and a wafer in a plasma etching apparatus upon the number of processed wafers, respectively for Steps 1-3 of the process recipe.

FIGS. 4A and 4B show the dependence of the flow rate of a helium gas flowing between a lower electrode and a wafer in a plasma etching apparatus upon the number of processed wafers, respectively for Steps 4 and 5 of the process recipe.

FIGS. 5A to 5C show the dependence of the gas pressure in a reaction chamber of the plasma etching apparatus upon the number of processed wafers, respectively for Steps 1-3 of the process recipe.

FIGS. 6A and 6B show the dependence of the gas pressure in the reaction chamber of the plasma etching apparatus upon the number of processed wafers, respectively for Steps 4 and 5 of the process recipe.

FIG. 7 shows the dependence of the first and second principal component values in a model upon the number of processed wafers, wherein the model is obtained as a result of multivariate analysis modeling performed on a plurality of process parameter values in the plasma etching apparatus.

DESCRIPTION OF THE PREFERRED EMBODIMENTS

Embodiment 1

Hereinafter, a system and method for monitoring a semiconductor production apparatus according to embodiment 1 of the present invention are described with reference to the drawings.

Figure 1:
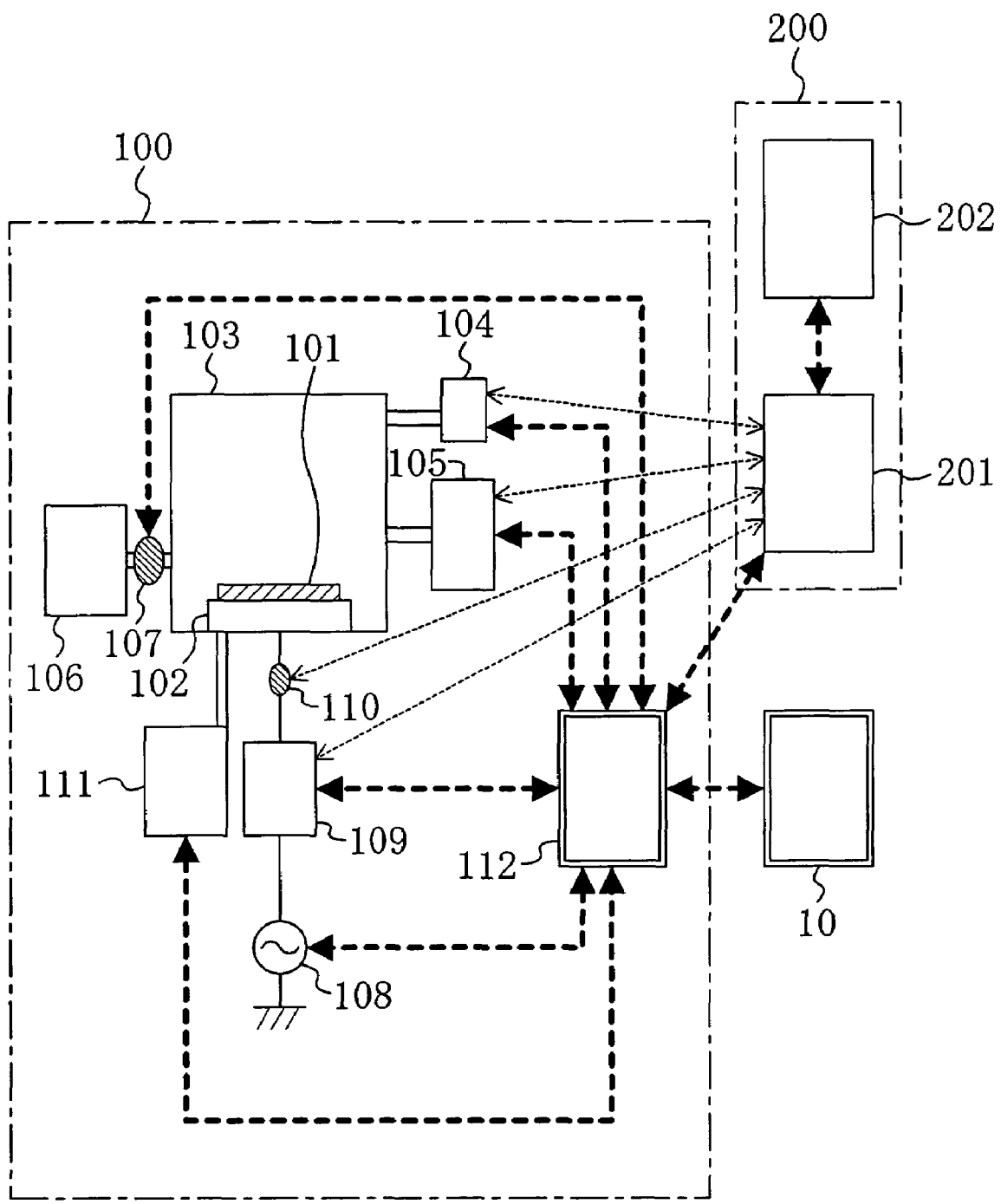
FIG. 1 illustrates monitoring of the operation status of a plasma etching apparatus with a monitoring system for monitoring a semiconductor production apparatus according to embodiment 1 of the present invention.

FIG. 1 illustrates monitoring of the operation status of a plasma etching apparatus with a monitoring system of embodiment 1.

As shown in FIG. 1, the plasma etching apparatus 100 includes a reaction chamber 103 having a lower electrode 102 on which a substrate 101 to be processed is placed. At one side of the reaction chamber 103, a flowmeter 104 through which a process gas is supplied into the reaction chamber 103 and a pressure sensor 105 for measuring the gas pressure in the reaction chamber 103 are connected. On the other side of the reaction chamber 103, a vacuum pump 106 for discharging the process gas is connected through a conductance valve 107. The conductance valve 107 adjusts the amount of the process gas to be discharged. At the bottom of the reaction chamber 103, a high frequency power supply 108 for supplying a high frequency power to the lower electrode 102 is connected through a matcher 109 and an additional sensor 110. Further, a chiller 111 is connected to the bottom of the reaction chamber 103.

Furthermore, the plasma etching apparatus 100 includes a controller computer 112 which is connected through signal lines to the control devices, i.e., the flowmeter 104, the pressure chamber 105, the conductance valve 107, the high frequency power supply 108, the matcher 109, and the chiller 111. The controller computer 112 retains a plurality of process parameter values acquired from the control devices, such as gas flow rate, gas pressure, degree of valve opening, plasma content value, etc., i.e., a plurality of pieces of process data, in the form of digital data for a certain time period. The controller computer 112 is connected via network to a host computer 10 which manages a plurality of semiconductor production apparatuses including the plasma etching apparatus 100, and to a monitoring tool 201 for ascertaining the operation status of the plasma etching apparatus 100. The monitoring tool 201 is included in a monitoring system 200 of embodiment 1. The monitoring tool 201 acquires a plurality of pieces of process data in the form of digital data from the controller computer 112. The monitoring tool 201 is directly connected through signal lines to some of the control devices of the plasma etching apparatus 100 (specifically, the flowmeter 104, the pressure chamber 105, the matcher 109, and the additional sensor 110). The monitoring tool 201 acquires a plurality of pieces of process data in the form of analog data directly from these control devices.

The monitoring system 200 of embodiment 1 includes an analyzer computer 202. The analyzer computer 202 is connected to the monitoring tool 201 via network and receives process data from the monitoring tool 201 on the real time basis. The analyzer computer 202 includes a program for dividing the process data for the respective process parameters and for respective steps of the process recipe, and a program for calculating a statistical value of divisional parts of the plurality of pieces of the process data (hereinafter, referred to as "divisional data"). Furthermore, the analyzer computer 202 includes a program for creating a multivariate analysis model, such as a principal component analysis model, or the like, using at least a portion of the plurality of pieces of process data or divisional data thereof, and a program for plotting in time series a principal component value, or the like, which is obtained by applying the created multivariate analysis model to a plurality of pieces of new process data.

Next, a method for monitoring a semiconductor production apparatus according to embodiment 1 is described with an example where a plurality of pieces of process data are acquired directly from the respective control devices of the plasma etching apparatus 100 in the form of analog data using the monitoring tool 201 shown in FIG. 1.

Figure 2:
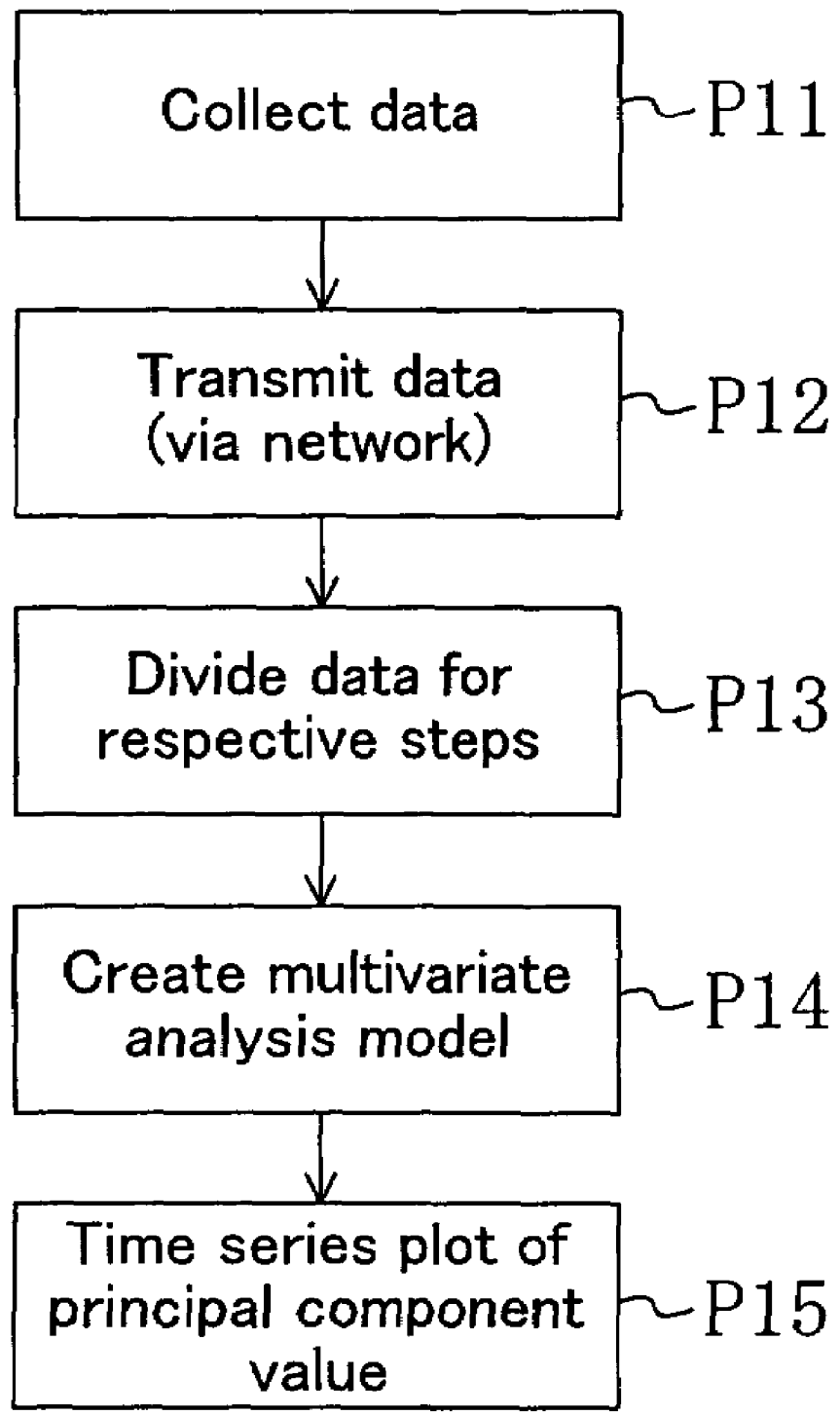
FIG. 2 is a flowchart of a monitoring method for monitoring a semiconductor production apparatus according to embodiment 1 of the present invention.

FIG. 2 is a flowchart of the monitoring method of embodiment 1.

In the first process P11, a plurality of pieces of process data are collected from the respective control devices of the plasma etching apparatus 100 using the monitoring tool 201 at a predetermined sampling rate.

In the second process P12, the plurality of pieces of process data collected by the monitoring tool 201 are transmitted to the analyzer computer 202 via network.

In the third process P13, in the analyzer computer 202, the plurality of pieces of process data are divided for the respective process parameters and for the respective steps of the process recipe.

In the fourth process P14, in the analyzer computer 202, a multivariate analysis model is created using at least a portion of the plurality of pieces of process data or divisional data thereof. Herein, a specific example of creation of the multivariate analysis model is dividing Data Matrix X of the plurality of pieces of process data into Score Vector T, Loading Vector P and Error Matrix E, as illustrated in Expression 1:

$$X = T \times P^t + E \quad \text{(Expression 1)}$$

where $P^t$ denotes a transposed vector of P.

In the fifth process P15, the multivariate analysis model created in the fourth process P14, e.g., a principal component analysis model, is applied to a plurality of pieces of new process data or new divisional data acquired in the same manner as that of process P11 to P13, thereby calculating a principal component value. The calculated principal component value is monitored in time series.

FIGS. 3A to 3C and FIGS. 4A and 4B show the dependence of the flow rate of a helium gas flowing between the lower electrode 102 and the substrate (wafer) 101 to be processed in the plasma etching apparatus 100 upon the number of processed wafers, separately for Steps 1-5 of the process recipe. Referring to FIGS. 3A to 3C and FIGS. 4A and 4B, the flow rate of the helium gas was abruptly increased at point A and point B. This is considered to be because particles were adhered onto the lower electrode 102 and the gap between the wafer 101 and the lower electrode 102 was increased. Furthermore, in every step, the average level of the flow rate of the helium gas is different between a term before point C and a term after point C. This is considered to be because a film was formed on the surface of the lower electrode 102 by wet cleaning of the reaction chamber 103 which was performed as maintenance of the plasma etching apparatus 100, and accordingly, the adsorption force of the lower electrode 102 onto the wafer 101 was decreased and the helium gas leaked (i.e., the flow rate of the helium gas was increased).

FIGS. 5A to 5C and FIGS. 6A and 6B show the dependence of the gas pressure in the reaction chamber 103 upon the number of processed wafers, respectively for Steps 1-5 of the process recipe. The gas pressure shown in FIGS. 5A to 5C and FIGS. 6A and 6B is an average value over the process time of each step. Referring to FIGS. 5A to 5C and FIGS. 6A and 6B where the process data is divided for the respective steps, it is clearly found that the value of the process data, i.e., the gas pressure in the reaction chamber 103, is greatly different among the respective steps. As seen at points A and B of FIGS. 5B and 6A, abrupt changes (abnormalities) in the gas pressure were detected in particular steps. If, on the other hand, the process data is not divided for the respective steps as in the conventional monitoring system, it is difficult to detect such an abnormality. This is because, in the conventional monitoring system, the process data is averaged over all the steps.

We performed modeling of a multivariate analysis on each of the process data in the plasma etching apparatus 100, i.e., the gas pressure and the plasma emission voltage in the reaction chamber 103, the flow rate of the helium gas flowing between the lower electrode 102 and the wafer 101, and the powers of the progressive wave and reflected wave of the high frequency power supplied from the high frequency power supply 108 to the lower electrode 102. FIG. 7 shows the dependence of the first and second principal components in the resultant model upon the number of processed wafers. As seen from FIG. 7, a change in the flow rate of the helium gas which occurred due to particles adhered on the lower electrode 102 is reflected in the first principal component. Note that a change in the plasma emission voltage which occurred immediately after wet cleaning (maintenance) is also reflected in the first principal component. On the other hand, it is seen that a change in the gas pressure in the reaction chamber 103 is reflected in the second principal component.

As described above, according to embodiment 1, a plurality of process parameter values acquired from a semiconductor production apparatus (plasma etching apparatus 100) while it is in operation, i.e., a plurality of pieces of process data, are used to create a multivariate analysis model. Thus, for example, calculation of a principal component value can be performed on a plurality of pieces of new process data, and real-time monitoring of the principal component, or the like, can also be performed. Therefore, by monitoring the principal component value in time series, evaluation of the operation status of a semiconductor production apparatus can be performed both objectively and quickly, as compared with a method of observing a large number of process parameter values and evaluating the observation results using a certain human sense.

Furthermore, according to embodiment 1, the process data acquired from the semiconductor production apparatus while it is in operation can be monitored separately with respect to the respective steps of the process recipe. Thus, by checking divisional data obtained by dividing the process data for the respective steps or a statistical value thereof when necessary, it is possible to accurately ascertain the operation status of the semiconductor production apparatus. For example, an abnormal device can be identified correctly.

In embodiment 1, a principal component analysis is used as a method for multivariate analysis, but the method for the multivariate analysis is not limited to any particular method. Other methods for multivariate analysis, such as multiple regression analysis, variance analysis, or the like, may be used.

Furthermore, in embodiment 1, a plurality of pieces of process data are acquired in the form of analog data from the respective control devices of the plasma etching apparatus 100 using the monitoring tool 201. However, alternatively, a plurality of pieces of process data may be acquired in the form of digital data from the controller computer 112 of the plasma etching apparatus 100 using the monitoring tool 201. In this case, the monitoring tool 201 may acquire the process data using a stream function which is based on a communication standard, such as SECS (Semiconductor Equipment Communications Standard), GEM (Generic Equipment Model), HSMS (High Speed Message Service), or the like. Alternatively, a plurality of pieces of process data may be acquired using the monitoring tool 201 from the controller computer 112 and the respective control devices in the form of digital data or analog data depending on the types of parameters.

Further still, in embodiment 1, the semiconductor production apparatus to be monitored is not limited to the plasma etching apparatus 100. As a matter of course, a general semiconductor production apparatus, such as a CVD (Chemical Vapor Deposition) apparatus, a CMP (Chemical Mechanical Polishing) apparatus, an ion implantation apparatus, a washing apparatus, an exposure apparatus, etc., may be monitored.

Embodiment 2

Hereinafter, a system and method for monitoring a semiconductor production apparatus according to embodiment 2 of the present invention are described with reference to the drawings.

In embodiment 1, the operation status of the semiconductor production apparatus, i.e., the plurality of process parameter values, is expressed using two principal component values. In such a case, the number of principal components employed is usually 2 to 3, which is smaller than the number of the process parameters. However, it is still necessary to manage a plurality of values. Embodiment 2 intends to solve such a problem.

Specifically, a difference of the monitoring system for a semiconductor production apparatus according to embodiment 2 from that of embodiment 1 is that the analyzer computer 202 (see FIG. 1) includes a program for calculating and monitoring distance Di between a plurality of pieces of new process data and a model using Error Matrix E (see Expression 1) obtained at the time of modeling of multivariate analysis and a program for determining based on distance Di whether the operation status of the plasma etching apparatus 100 is normal or abnormal.

Figure 8:
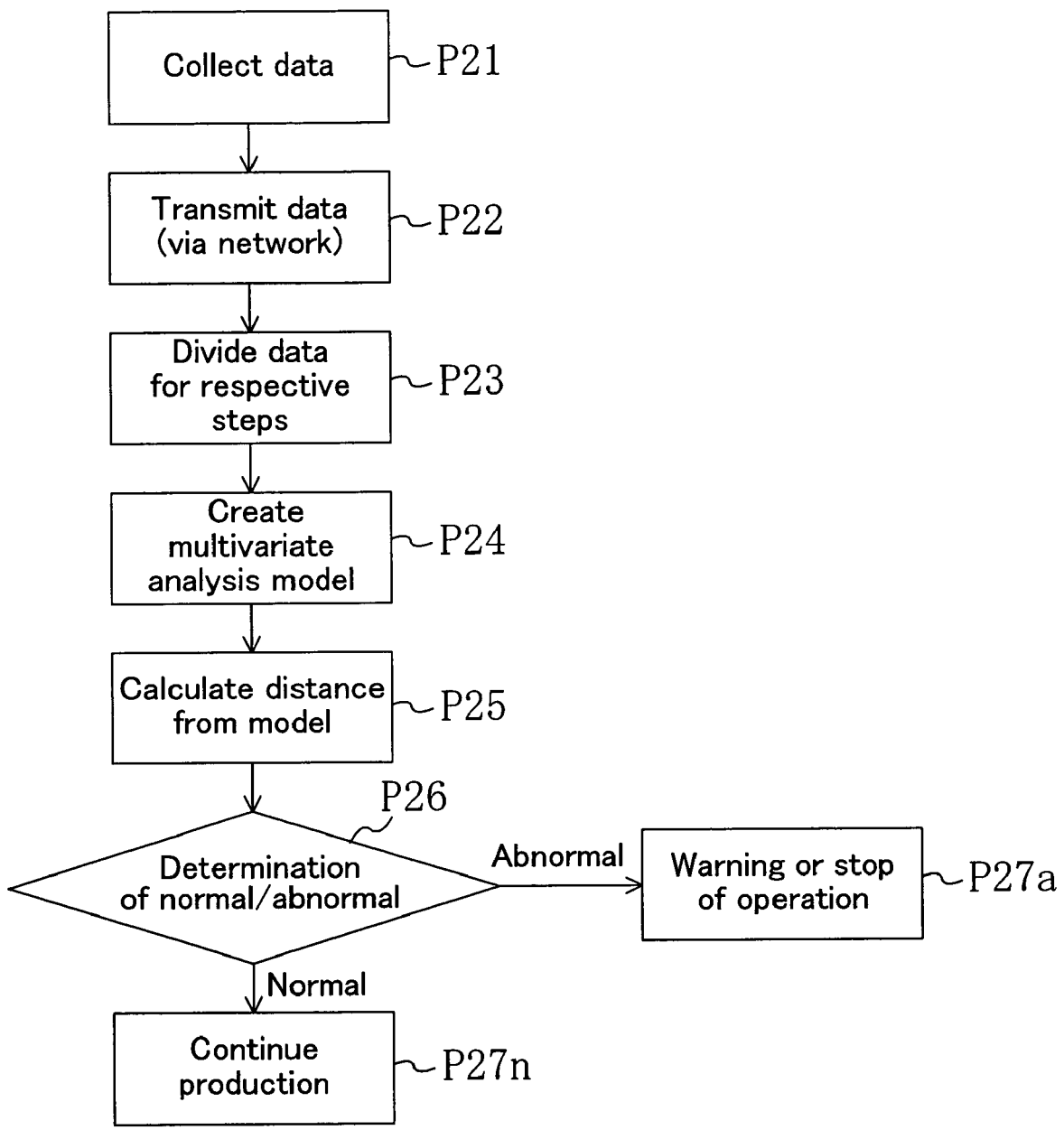
FIG. 8 is a flowchart of a monitoring method for monitoring a semiconductor production apparatus according to embodiment 2 of the present invention.

FIG. 8 is a flowchart of the monitoring method for a semiconductor production apparatus according to embodiment 2.

Processes P21 to P24 of FIG. 8 are the same as the processes P11 to P14 of embodiment 1 shown in FIG. 2.

In the fifth process P25, a multivariate analysis model created in the process P24 is applied to a plurality of pieces of new process data or new divisional data which is obtained in the same manner as that of the processes P21 to P23, thereby obtaining Error Matrix E. In this process, each element of Error Matrix E is squared, and the sum of the squared elements is calculated. The calculated sum is divided by the degree of freedom, and the quotient of the division is square-rooted, thereby obtaining distance Di between the plurality of pieces of process data and the model.

Next, in the sixth process P26, it is determined based on distance Di from the model, which is obtained in the fifth process P25, whether the operation status of the semiconductor production apparatus (plasma etching apparatus 100) is normal or abnormal.

Figure 9:
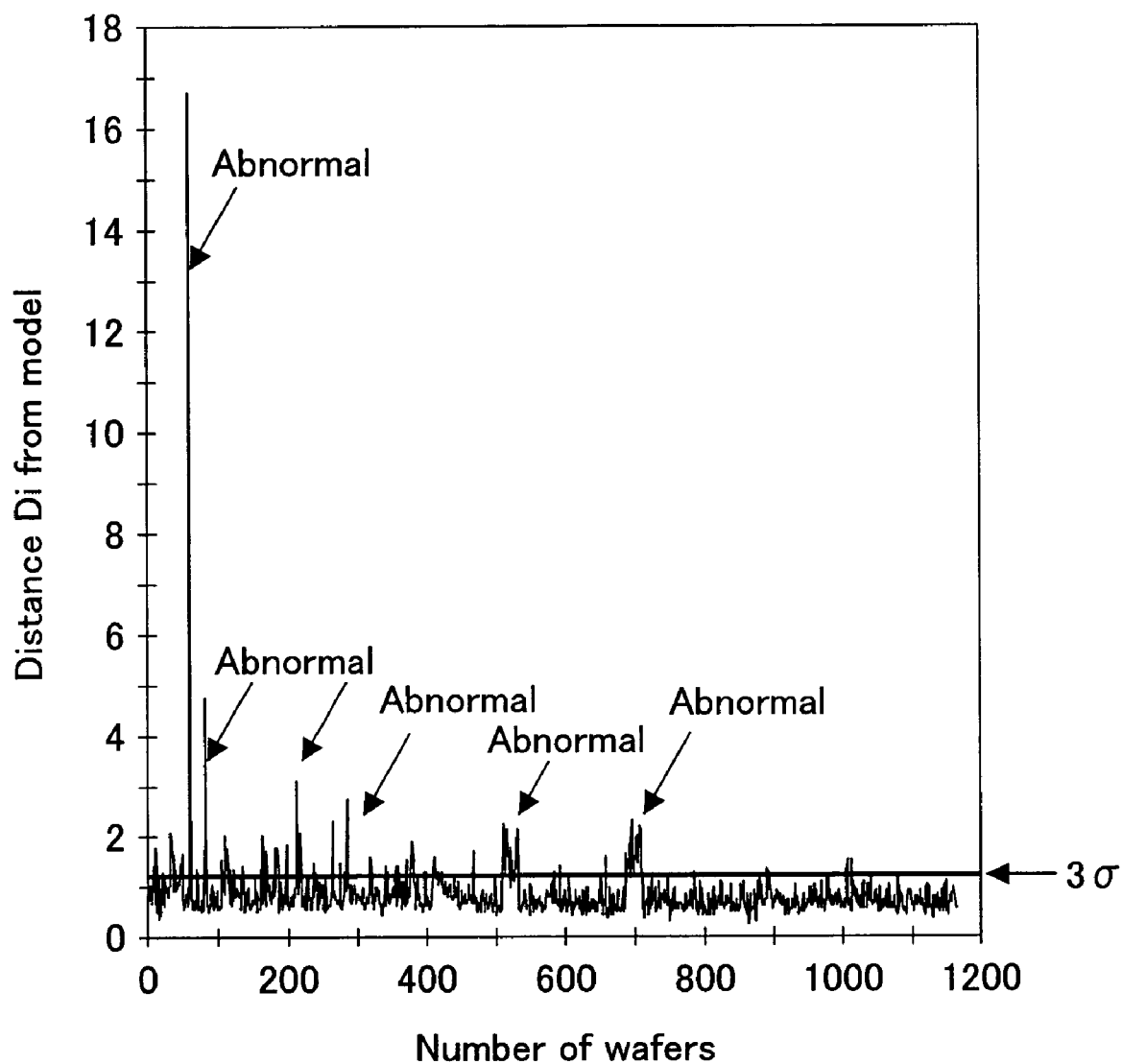
FIG. 9 shows the dependence of distance Di from a model upon the number of processed wafers, wherein the model is obtained from Error Matrix E using the monitoring method of embodiment 2 of the present invention.

FIG. 9 shows the dependence of distance Di from the model which is obtained from Error Matrix E upon the number of processed wafers. Herein, the operation status of the plasma etching apparatus 100 is determined using as a reference a variance, $\sigma$, of distance Di between the plurality of pieces of process data and the model which occurs during a period when the operation status of the plasma etching apparatus 100 is objectively determined to be normal (e.g., a period when the production yield is greater than a predetermined value). Specifically, when distance Di between a plurality of pieces of new process data and the model is smaller than $3\sigma$, the operation status is determined to be "normal state". When distance Di is equal to or greater than $3\sigma$ and equal to or smaller than $6\sigma$, the operation status is determined to be "warning state". When distance Di is greater than $6\sigma$, the operation status is determined to be "fault state (abnormal state)". As seen in FIG. 9, a deterioration in the operation status of the plasma etching apparatus 100 which is caused by an increase in the flow rate of the helium gas (for example, the helium gas flow rate may be increased due to particles adhered on the lower electrode 102) was detected as an abnormality based on the monitoring result of distance Di from the model. That is, it is understood that the value of distance Di from the model can be used as an index which represents the operation status of the semiconductor production apparatus.

If it is determined in the sixth process P26 that the operation status of the plasma etching apparatus 100 is normal, the plasma etching apparatus 100 is instructed to continue production (process P27n). If, on the other hand, it is determined in the sixth process P26 that the operation status of the plasma etching apparatus 100 is the warning state, a warning is issued; and if it is determined in the sixth process P26 that the operation status is abnormal, the plasma etching apparatus 100 is instructed to stop its operation (process P27a).

As described above, according to embodiment 2, a multivariate analysis model is created using a plurality of pieces of process data which are acquired from a semiconductor production apparatus (plasma etching apparatus 100) while it is in operation. Thus, it is possible to calculate distance Di between a plurality of pieces of new process data and the model, and to perform real-time monitoring of distance Di from the model. Specifically, it is possible to quantitatively obtain distance Di between a plurality of pieces of new process data and the model using, for example, Error Matrix E, and to determine based on distance Di whether the operation status of the plasma etching apparatus 100 is normal or abnormal. As a result, it is possible to represent the operation status of the plasma etching apparatus 100 by a single value (index value). Since the operation status of the plasma etching apparatus 100 can be represented as an index, the operation status of the plasma etching apparatus 100 can be managed by managing the index value. Therefore, evaluation of the operation status of the plasma etching apparatus 100 can be performed both objectively and more quickly.

Furthermore, according to embodiment 2, the process data acquired from the semiconductor production apparatus while it is in operation can be monitored separately for the respective steps of the process recipe. Thus, ascertainment of the operation status of the semiconductor production apparatus, e.g., identification of an abnormal device, can be carried out precisely by checking divisional data, which is obtained by dividing the process data for the respective steps, or a statistical value of the divisional data as necessary.

In embodiment 2, a plurality of pieces of process data are acquired from the respective control devices of the plasma etching apparatus 100 in the form of analog data using the monitoring tool 201. However, alternatively, a plurality of pieces of process data may be acquired from the controller computer 112 of the plasma etching apparatus 100 in the form of digital data using the monitoring tool 201. In this step, the monitoring tool 201 may acquire the process data using a stream function which is based on a communication standard, such as SECS, GEM, HSMS, or the like. Alternatively, a plurality of pieces of process data may be acquired using the monitoring tool 201 from the controller computer 112 and the respective control devices in the form of digital data or analog data depending on the types of parameters.

Furthermore, in embodiment 2, the semiconductor production apparatus to be monitored is not limited to the plasma etching apparatus 100. As a matter of course, a general semiconductor production apparatus, such as a CVD apparatus, a CMP apparatus, an ion implantation apparatus, a washing apparatus, an exposure apparatus, etc., may be monitored.

Further still, in embodiment 2, the operation status of the plasma etching apparatus 100 is determined using as a reference a variance, $\sigma$, of distance Di between the plurality of pieces of process data and the model which occurs during a period when the operation status of the plasma etching apparatus 100 is objectively determined to be normal. Specifically, when distance Di between a plurality of pieces of new process data and the model is smaller than $3\sigma$, the operation status is determined to be "normal state". When distance Di is equal to or greater than $3\sigma$ and equal to or smaller than $6\sigma$, the operation status is determined to be "warning state". When distance Di is greater than $6\sigma$, the operation status is determined to be "fault state (abnormal state)". However, as a matter of course, the threshold for determining whether the operation status of the semiconductor production apparatus is normal or abnormal is not limited to any particular threshold.

Embodiment 3

Hereinafter, a system and method for monitoring a semiconductor production apparatus according to embodiment 3 of the present invention are described with reference to the drawings.

In embodiment 1, the process data which represents the operation status of the semiconductor production apparatus is not coupled to process lot information (lot number, the number of wafers, product type, etc.), and therefore, the following problem may occur. For example, in order to analyze the operation status of the production apparatus when defective wafer processing is performed, or in order to identify a wafer which is processed when the operation status of the production apparatus is changed, it is necessary in embodiment 1 to collate data regarding a wafer to be processed, which is retained in the host computer which manages the semiconductor production apparatus, with the process data, and this collation requires much time. Embodiment 3 intends to solve such a problem.

Figure 10:
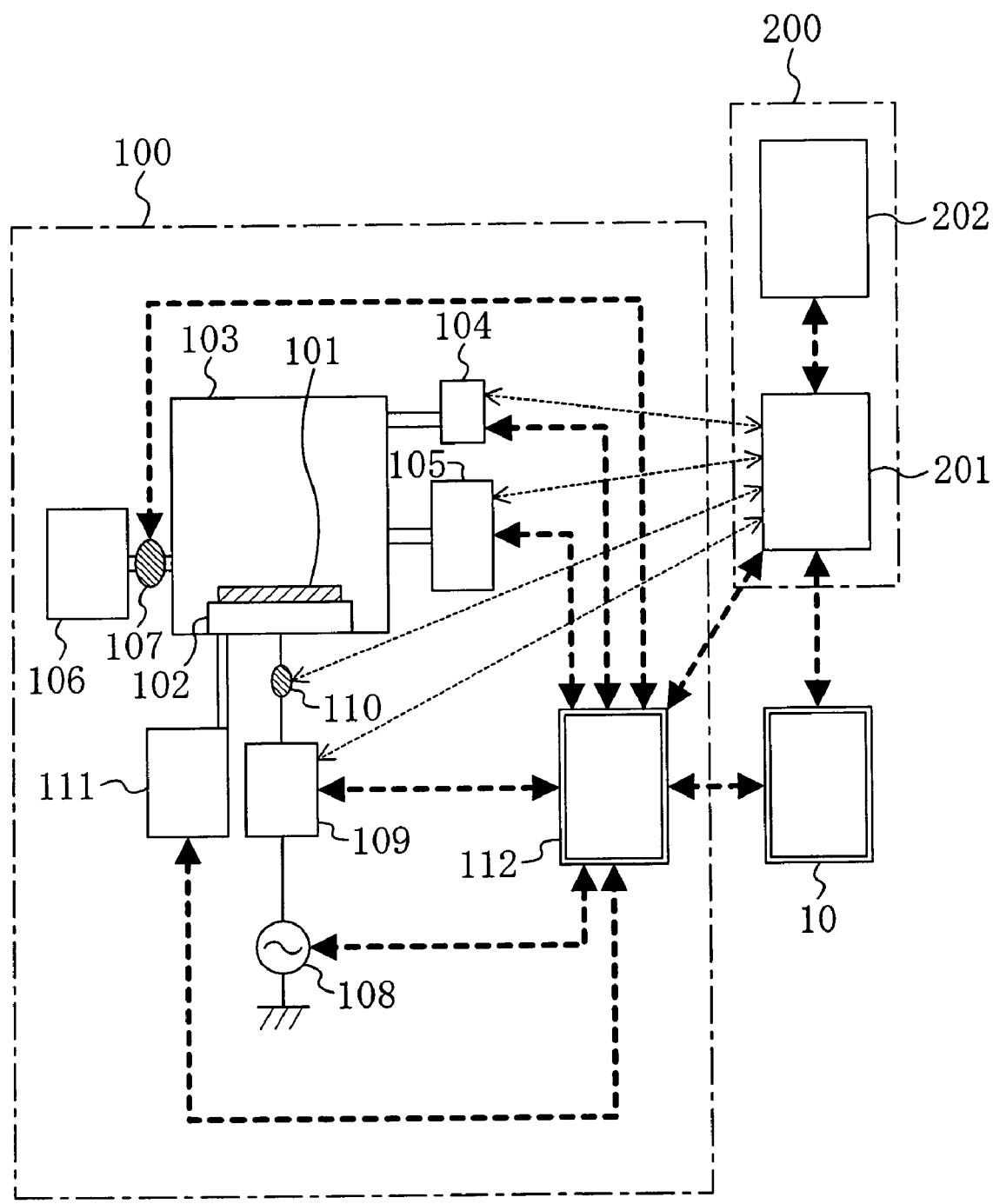
FIG. 10 illustrates monitoring of the operation status of a plasma etching apparatus with a monitoring system for monitoring a semiconductor production apparatus according to embodiment 3 of the present invention.

FIG. 10 illustrates monitoring of the operation status of a plasma etching apparatus with a monitoring system of embodiment 3. In FIG. 10, like elements are denoted by like reference numerals shown in FIG. 1 of embodiment 1, and descriptions thereof are herein omitted.

Referring to FIG. 10, the structure for allowing the monitoring system 200 of embodiment 3 to collect a plurality of pieces of process data from the respective control devices (or the controller computer 112) of the plasma etching apparatus 100 is the same as that of embodiment 1 shown in FIG. 1. A difference of the monitoring system 200 of embodiment 3 from the monitoring system of embodiment 1 is that the monitoring tool 201 is connected via network to the host computer 10 which retains process lot information of the plasma etching apparatus 100. With such an arrangement, the monitoring tool 201 can communicate with the host computer 10 to acquire the process lot information. The monitoring tool 201 adds the process lot information to the plurality of pieces of process data collected from the plasma etching apparatus 100.

Next, a method for monitoring a semiconductor production apparatus according to embodiment 3 is described with an example where a plurality of pieces of process data are acquired from the respective control devices of the plasma etching apparatus 100 in the form of analog data using the monitoring tool 201 shown in FIG. 10.

Figure 11:
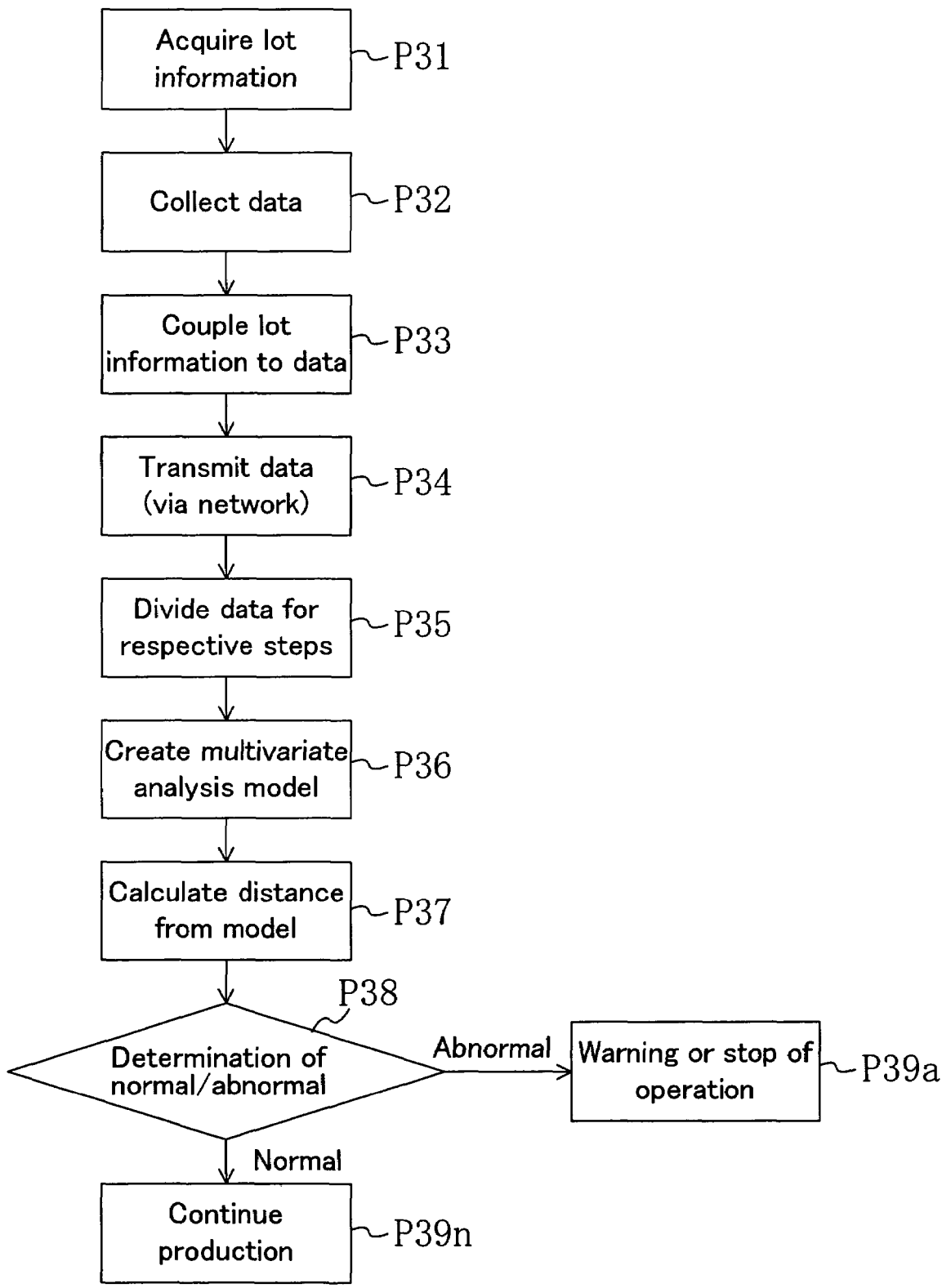
FIG. 11 is a flowchart of a monitoring method for monitoring a semiconductor production apparatus according to embodiment 3 of the present invention.

FIG. 11 is a flowchart of the monitoring method for a semiconductor production apparatus according to embodiment 3.

In the first process P31, process lot information is acquired from the host computer 10 using the monitoring tool 201.

In the second process P32, in response to a signal which triggers start of a lot process in the plasma etching apparatus 100 (for example, an ON signal of the high frequency power), a plurality of pieces of process data are collected from the respective control devices of the plasma etching apparatus 100 using the monitoring tool 201 at a predetermined sampling rate. Specifically, in many cases, each process data is collected at a sampling rate in the range of 0.1 to 100 Hz.

In the third process P33, in the monitoring tool 201, the process lot information acquired in the first process P31 is added to the plurality of pieces of process data collected in the second process P32, thereby coupling the process lot information to the plurality of pieces of process data.

In the fourth process P34, the plurality of pieces of process data, which have been coupled to the process lot information, are transmitted from the monitoring tool 201 to the analyzer computer 202 via network.

In the fifth process P35, in the analyzer computer 202, the plurality of pieces of process data are divided for the respective process parameters and for the respective steps of the process recipe.

In the sixth process P36, in the analyzer computer 202, a multivariate analysis model is created using at least a portion of the plurality of pieces of process data or divisional data in the same manner as in the process P14 of embodiment 1.

In the seventh process P37, the multivariate analysis model created in the process P36 is applied to a plurality of pieces of new process data or new divisional data which is obtained in the same manner as that of the processes P31 to P35 (to which the process lot information is added in any case), thereby obtaining Error Matrix E. In this process, as in the fifth process P25 of embodiment 2, distance Di between the plurality of pieces of process data and the model is calculated from Error Matrix E.

In the eighth process P38, as in the sixth process P26 of embodiment 2, it is determined based on distance Di from the model, which has been obtained in the fifth process P37, whether the operation status of the semiconductor production apparatus (plasma etching apparatus 100) is normal or abnormal.

If it is determined in the eighth process P38 that the operation status of the plasma etching apparatus 100 is normal, the plasma etching apparatus 100 is instructed to continue production (process P39$n$). If, on the other hand, it is determined in the eighth process P38 that the operation status of the plasma etching apparatus 100 is the warning state, a warning is issued; and if it is determined in the eighth process P38 that the operation status is abnormal, the plasma etching apparatus 100 is instructed to stop its operation (process P39$a$).

As described above, according to embodiment 3, the following effects can be obtained in addition to the effects of embodiment 2. Specifically, according to embodiment 3, the process lot information is coupled to the process data on the data space, and therefore, it is possible to know in what operation status each wafer of each lot is processed, in a one-to-one manner. That is, it is possible to collate the operation statuses of the semiconductor production apparatus with results of wafer processing in each lot (i.e., lot results) and, on the contrary, to collate the lot results with the operation statues of the semiconductor production apparatus. Thus, it is possible to quickly ascertain what operation status the semiconductor production apparatus was in when a defective wafer process was performed.

In embodiment 3, a plurality of pieces of process data are acquired from the respective control devices of the plasma etching apparatus 100 in the form of analog data using the monitoring tool 201. However, alternatively, a plurality of pieces of process data may be acquired from the controller computer 112 of the plasma etching apparatus 100 in the form of digital data using the monitoring tool 201. In this step, the monitoring tool 201 may acquire the process data using a stream function which is based on a communication standard, such as SECS, GEM, HSMS, or the like. Alternatively, a plurality of pieces of process data may be acquired using the monitoring tool 201 from the controller computer 112 and the respective control devices in the form of digital data or analog data depending on the types of parameters.

Furthermore, in embodiment 3, the semiconductor production apparatus to be monitored is not limited to the plasma etching apparatus 100. As a matter of course, a general semiconductor production apparatus, such as a CVD apparatus, a CMP apparatus, an ion implantation apparatus, a washing apparatus, an exposure apparatus, etc., may be monitored.

Furthermore, in embodiment 3, the process lot information is acquired from the host computer 10 using the monitoring tool 201. However, alternatively, the process lot information may be acquired from the controller computer 112 of the plasma etching apparatus 100 using the monitoring tool 201. This is because, in many cases, the controller computer 112 retains the process lot information transmitted from the host computer 10.

Further still, in embodiment 3, the process lot information is acquired by a communication between the monitoring tool 201 and the host computer 10. However, alternatively, the process lot information may be acquired through a communication between the analyzer computer 202 and the host computer 10 or the controller computer 112. In this case, the analyzer computer 202 adds the process lot information to a plurality of pieces of process data transmitted from the monitoring tool 201.

Embodiment 4

Hereinafter, a system and method for monitoring a semiconductor production apparatus according to embodiment 4 of the present invention are described with reference to the drawings.

In embodiments 1-3, methods for reducing the number of the process parameter values which represent the operation status of a semiconductor production apparatus to a smaller number of index values (e.g., the principal component value, the distance from a model, etc.) have been described. However, in order to obtain these index values, it is required that a human accesses the monitoring system 200 or the analyzer computer 202. Considering that in actual production of semiconductor devices, a factory has a large number of semiconductor production apparatuses, e.g., about 100 to 1000 apparatuses in general, although it is different depending on the manufacturing capacity of the factory, it is difficult for a human(s) to monitor such a large number of semiconductor production apparatuses in a one-by-one manner. Embodiment 3 intends to solve such a problem.

Figure 12:
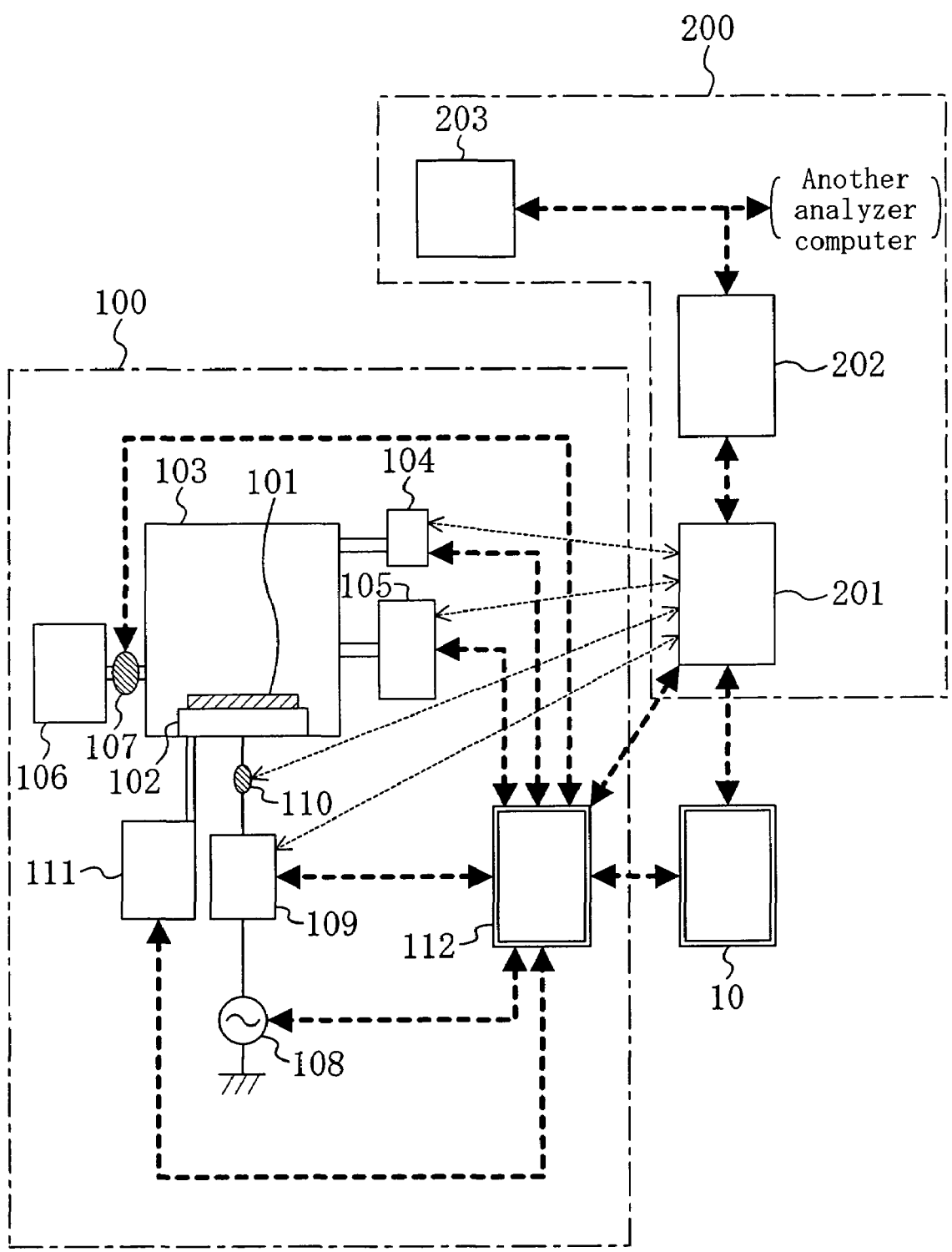
FIG. 12 illustrates monitoring of the operation status of a plasma etching apparatus with a monitoring system for monitoring a semiconductor production apparatus according to embodiment 4 of the present invention.

FIG. 12 illustrates monitoring of the operation status of a plasma etching apparatus with a monitoring system of embodiment 4. In FIG. 12, like elements are denoted by like reference numerals shown in FIG. 10 of embodiment 3, and descriptions thereof are herein omitted.

Referring to FIG. 12, the structure for allowing the monitoring system 200 of embodiment 4 to collect a plurality of pieces of process data from the respective control devices (or the controller computer 112) of the plasma etching apparatus 100 is the same as that of embodiment 3 shown in FIG. 10. A difference of the monitoring system 200 of embodiment 4 from the monitoring system of embodiment 3 is that the monitoring system 200 includes a central monitoring device 203 which is connected to the analyzer computer 202. The central monitoring device 203 is also connected to another analyzer computer which is combined with another monitoring tool for ascertaining the operation status of another semiconductor production apparatus (not shown).

The central monitoring device 203 accesses the analyzer computer 202 to acquire an index value which represents the operation status of the semiconductor production apparatus (e.g., the principal component value, the distance from a model, or the like) as described in embodiments 1-3, and outputs a warning, or the like, according to the acquired index value. Specifically, the central monitoring device 203 determines the operation status of the plasma etching apparatus 100 using as a reference a variance, a, of distance Di between the plurality of pieces of process data and the model which occurs during a period when the operation status of the plasma etching apparatus 100 is objectively determined to be normal (e.g., a period when the production yield is greater than a predetermined value). For example, when distance Di between a plurality of pieces of new process data and the model is smaller than 3σ, the operation status is determined to be "normal state". When distance Di is equal to or greater than 3σ and equal to or smaller than 6σ, the operation status is determined to be "warning state". When distance Di is greater than 6σ, the operation status is determined to be "fault state (abnormal state)". Further, the central monitoring device 203 can control the operation of the plasma etching apparatus 100 using a stream function which is based on a communication standard, such as SECS, GEM, HSMS, or the like. For example, when the central monitoring device 203 determines the operation status of the plasma etching apparatus 100 to be the fault state, the central monitoring device 203 issues a warning and stops the operation of the plasma etching apparatus 100.

Figure 13:
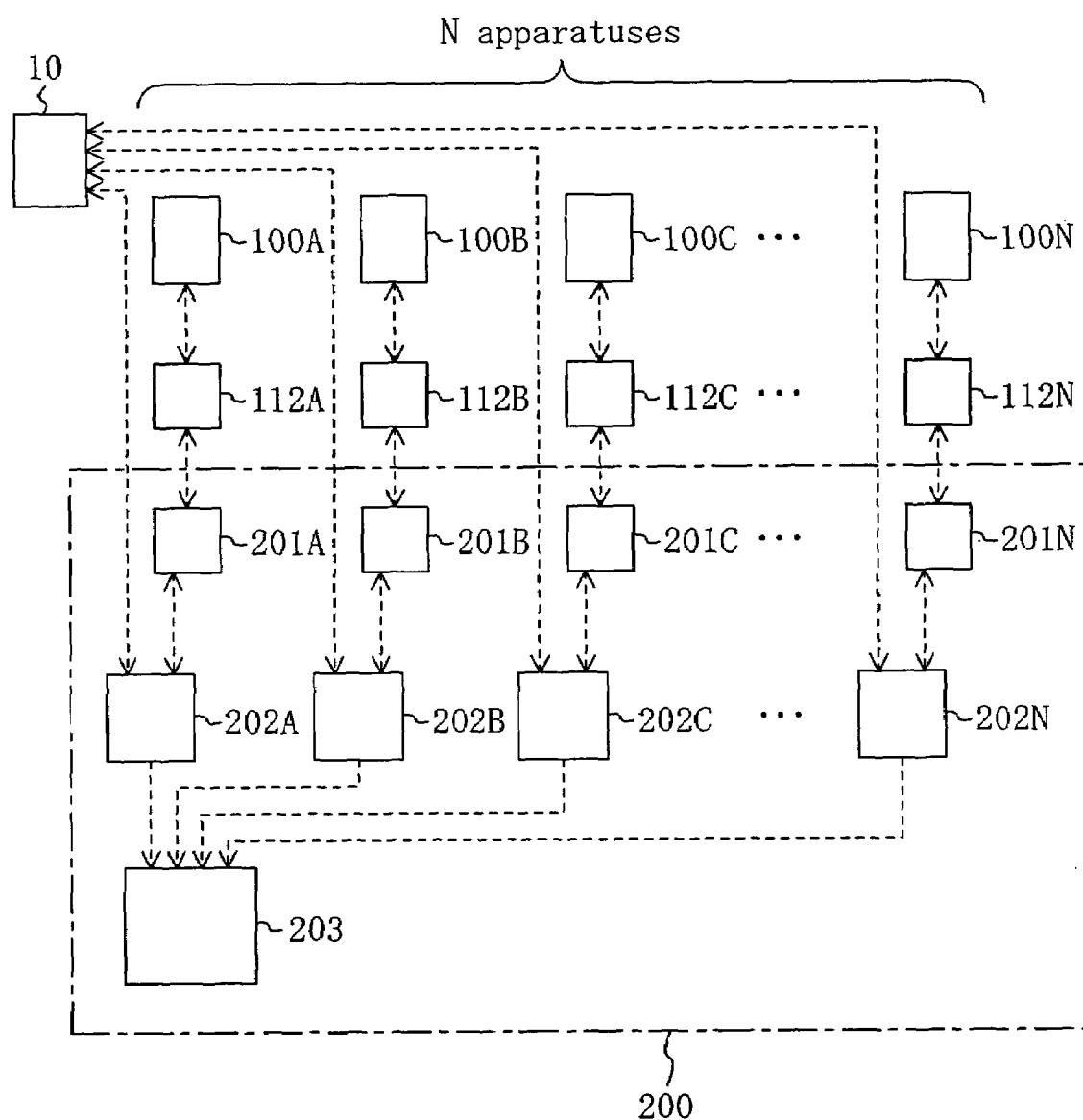
FIG. 13 illustrates monitoring of the operation statuses of a plurality of semiconductor production apparatuses with the monitoring system for monitoring a semiconductor production apparatus according to embodiment 4 of the present invention.
Figure 14:
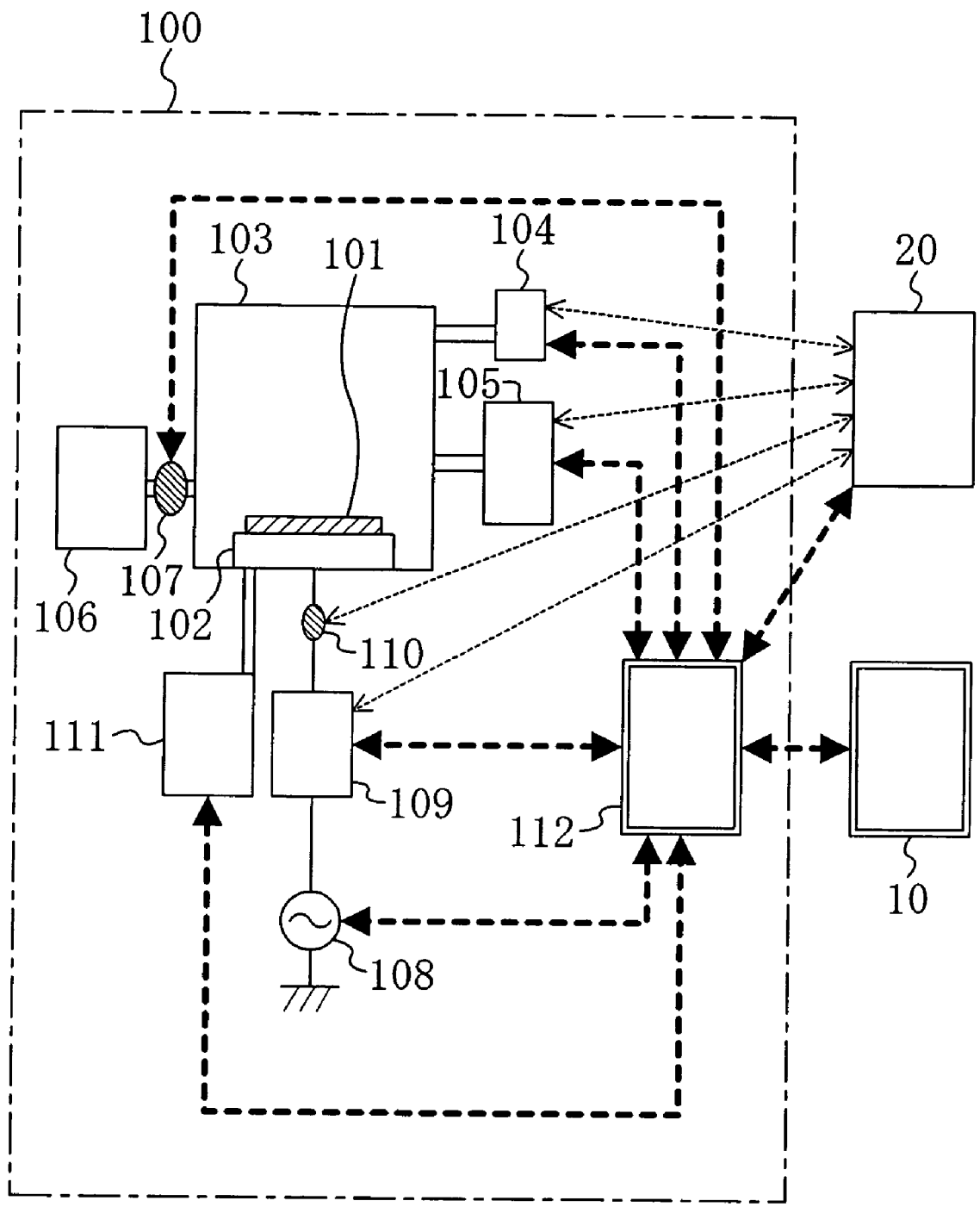
FIG. 14 illustrates monitoring of the operation status of a plasma etching apparatus with a conventional monitoring apparatus.
Figure 15:
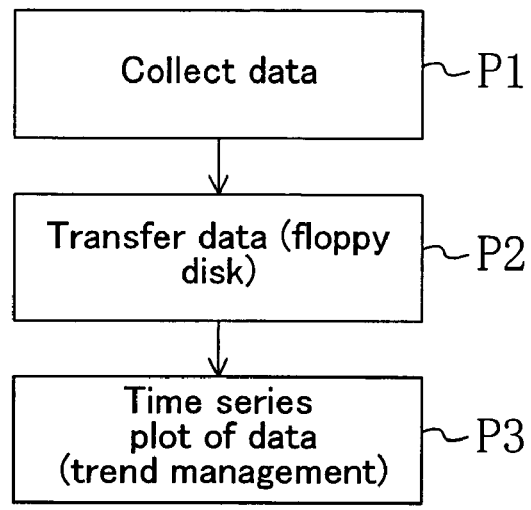
FIG. 15 is a flowchart of a conventional monitoring method for monitoring a semiconductor production apparatus.
Figure 16:
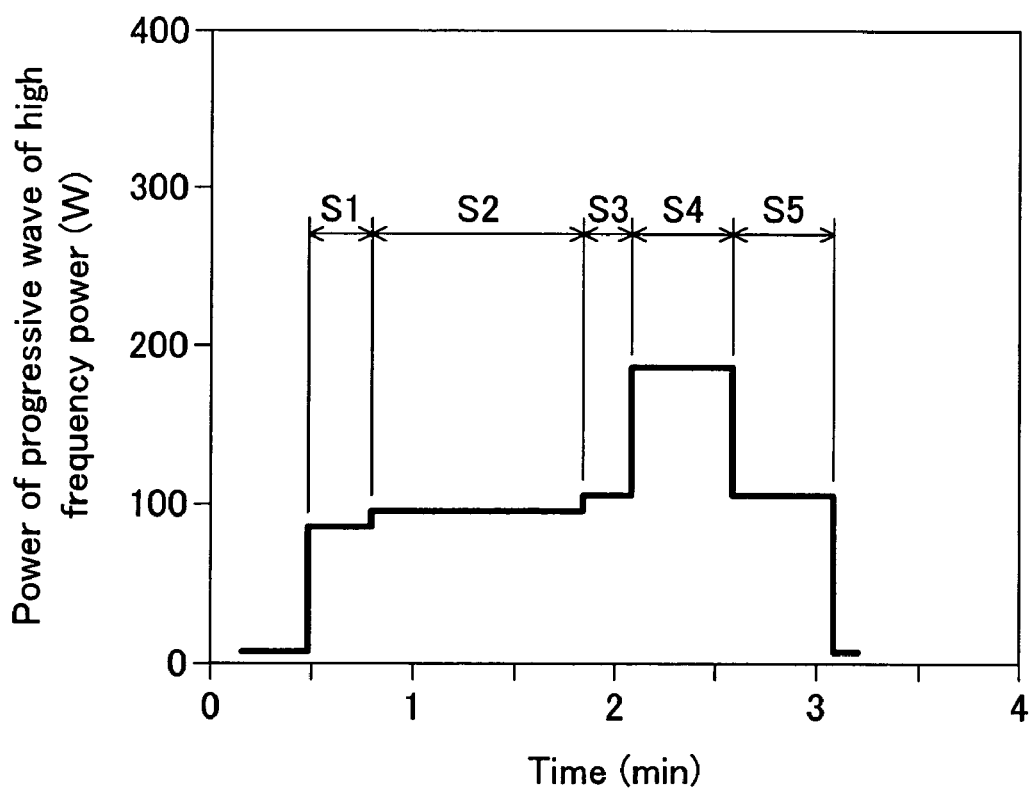
FIG. 16 shows a monitoring result of the power of a progressive wave of a high frequency power applied to a lower electrode in an etching apparatus.

FIG. 13 illustrates monitoring of the operation statuses of a plurality of semiconductor production apparatuses with the central monitoring device 203 of embodiment 4. In FIG. 13, the connections between a controller computer of each semiconductor production apparatus and the other components (control devices, etc.) of the semiconductor production apparatus are not shown for convenience of illustration.

Referring to FIG. 13, the monitoring system 200 includes N monitoring tools 201A to 201N which are respectively connected to N semiconductor production apparatuses 100A to 100N (precisely, controller computers 112A to 112N of the semiconductor production apparatuses 100A to 100N), N analyzer computers 202A to 202N which are respectively connected to the monitoring tools 201A to 201N, and one central monitoring device 203 which is connected to the analyzer computers 202A to 202N. The analyzer computers 202A to 202N are connected to the host computer 10 which manages the semiconductor production apparatuses 100A to 100N. The relationship between each semiconductor production apparatus including a controller computer and a corresponding set of a monitoring tool and a analyzer computer is the same as that described in embodiments 1-3. Moreover, the monitoring tools 201A to 201N are respectively connected to the control devices of the semiconductor production apparatuses 100A to 100N, and the controller computers 112A to 112N of the semiconductor production apparatuses 100A to 100N are connected to the host computer 10, although these connections are not shown.

In embodiment 4, one central monitoring device 203 is provided for the N analyzer computers 202A to 202N, and the central monitoring device 203 acquires index values representing the operation statuses of the semiconductor production apparatuses 100A to 100N which are calculated in the respective analyzer computers 202A to 202N. Specifically, the central monitoring device 203 accesses the analyzer computers 202A to 202N in a cyclic manner, one by one at a frequency of one second. That is, assuming that one second is consumed to access one analyzer computer, N seconds are consumed to access all of the analyzer computers. As a matter of course, it is preferable that the time consumed for accessing all of the analyzer computers is reduced by reducing the time consumed for accessing one analyzer computer. For example, in the case where accesses to the analyzer computers are established via some communication means, the time consumed for accessing one analyzer computer is preferably set to 0.1 second. As described above, according to embodiment 4, one central monitoring device is provided for the N analyzer computers. However, the time consumed for accessing all of the analyzer computers can be reduced by providing a larger number of central monitoring devices and dividing the task of accessing all of the analyzer computers among the plurality of central monitoring devices.

As described above, according to embodiment 4, the following effects can be obtained in addition to the effects of embodiments 1-3. Specifically, the monitoring system 200 of embodiment 4 includes the central monitoring device 203 which accesses the plurality of analyzer computers 202A to 202N at a predetermined time interval to acquire results (index values) of determination by the respective analyzer computers 202A to 202N as to whether the operation statuses of the corresponding plurality of semiconductor production apparatuses 100A to 100N are normal or abnormal. Thus, it is possible to automatically ascertain the operation statuses of the semiconductor production apparatuses 100A to 100N.

It should be noted that, in embodiment 4, the semiconductor production apparatus to be monitored is not limited to the plasma etching apparatus 100. As a matter of course, a general semiconductor production apparatus, such as a CVD apparatus, a CMP apparatus, an ion implantation apparatus, a washing apparatus, an exposure apparatus, etc., may be monitored.

Furthermore, in embodiment 4, the operation status of the plasma etching apparatus 100 is determined using as a reference a variance, σ, of distance Di between the plurality of pieces of process data and the model which occurs during a period when the operation status of the plasma etching apparatus 100 is objectively determined to be normal. For example, when distance Di between a plurality of pieces of new process data and the model is smaller than 3σ, the operation status is determined to be "normal state". When distance Di is equal to or greater than 3σ and equal to or smaller than 6σ, the operation status is determined to be "warning state". When distance Di is greater than 6σ, the operation status is determined to be "fault state (abnormal state)". However, as a matter of course, the threshold for determining whether the operation status of the plasma etching apparatus 100 is normal or abnormal is not limited to any particular threshold.

What is claimed is:

1. A monitoring method comprising the steps of:
(a) acquiring from a plasma etching apparatus a plurality of pieces of process data including values of a plurality of process parameters which are obtained while the plasma etching apparatus is in operation;
(b) after the step (a), dividing the plurality of pieces of process data for the respective process parameters and for respective steps of a process recipe for operating the plasma etching apparatus;
(c) after the step (b), creating a multivariate analysis model using data obtained by dividing the plurality of pieces of process data;
(d) after the step (c), obtaining a principal component value from the plurality of pieces of process data which are newly acquired, by using the multivariate analysis model; and
(e) after the step (d), determining whether the plasma etching apparatus is in normal operation or abnormal operation using the principal component value,
wherein the plurality of pieces of process data includes: a gas pressure and plasma emission voltage in a reaction chamber, a flow rate of helium gas flowing between a lower electrode and a wafer; and powers of a progressive wave and a reflected wave of a high frequency power supplied from a high frequency power supply to the lower electrode.

2. The monitoring method of claim 1, wherein the plasma etching apparatus includes a plurality of control devices and a controller computer connected to the plurality of control devices, and
in the step (a), the plurality of pieces of process data is obtained from the controller computer in the form of digital data.

3. The monitoring method of claim 2, wherein in the step (a) the plurality of pieces of process data is obtained by using SECS (Semiconductor Equipment Communications Standard), GEM (Genetic Equipment Model) or HSMS (High Speed Message Service) as a communication standard.

4. The monitoring method of claim 1, wherein the plasma etching apparatus includes a plurality of control devices, and
in the step (a), the plurality of pieces of process data is obtained from the plurality of control devices in the form of analog data.

5. The monitoring method of claim 1, wherein in the step (d) the plurality of pieces of process data which are newly acquired includes information to be used in the plasma etching apparatus.

6. A monitoring system comprising means for:
(a) acquiring from a plasma etching apparatus a plurality of pieces of process data including values of a plurality of process parameters which are obtained while the plasma etching apparatus is in operation;
(b) dividing the plurality of pieces of process data for the respective process parameters and for respective steps of a process recipe for operating the plasma etching apparatus;
(c) creating a multivariate analysis model using data obtained by dividing the plurality of pieces of process data;
(d) obtaining a principal component value from the plurality of pieces of process data which are newly acquired, by using the multivariate analysis model; and
(e) determining whether the plasma etching apparatus is in normal operation or abnormal operation using the principal component value,
wherein the plurality of pieces of process data includes a gas pressure and plasma emission voltage in a reaction chamber; a flow rate of helium gas flowing between a lower electrode and a wafer; and powers of a progressive wave and a reflected wave of a high frequency power supplied from a high frequency power supply to the lower electrode.

7. The monitoring system of claim 6, wherein the plasma etching apparatus includes a plurality of control devices and a controller computer connected to the plurality of control devices, and the means (a) is connected to the controller computer and obtains, from the controller computer, the plurality of pieces of process data in the form of digital data.

8. The monitoring system of claim 7, wherein the means (s) obtains the plurality of pieces of process data by using SECS (Semiconductor Equipment Communications Standard), GEM (Genetic Equipment Model) or HSMS (High Speed Message Service) as a communication standard.

9. The monitoring system of claim 6, wherein the plasma etching apparatus includes a plurality of control devices, and the means (a) is connected to the plurality of control devices and obtains, from the plurality of control devices, the plurality of pieces of process data in the form of analog data.

10. The monitoring system of claim 6, wherein the plurality of pieces of process data which are newly acquired includes information to be used in the plasma etching apparatus.

* * * * *